United States Patent
King et al.

(10) Patent No.: US 11,800,717 B2
(45) Date of Patent: Oct. 24, 2023

(54) MICROELECTRONIC DEVICES INCLUDING ISOLATION STRUCTURES PROTRUDING INTO UPPER PILLAR PORTIONS, AND RELATED METHODS AND SYSTEMS

(71) Applicant: Micron Technology, Inc., Boise, ID (US)

(72) Inventors: Matthew J. King, Boise, ID (US); David A. Daycock, Singapore (SG); Yoshiaki Fukuzumi, Tokyo (JP); Albert Fayrushin, Boise, ID (US); Richard J. Hill, Boise, ID (US); Chandra S. Tiwari, Boise, ID (US); Jun Fujiki, Tokyo (JP)

( * ) Notice: Subject to any disclaimer, the term of this patent is extended or adjusted under 35 U.S.C. 154(b) by 0 days.

(21) Appl. No.: 17/661,659

(22) Filed: May 2, 2022

(65) Prior Publication Data

US 2022/0262820 A1    Aug. 18, 2022

Related U.S. Application Data

(63) Continuation of application No. 17/007,951, filed on Aug. 31, 2020, now Pat. No. 11,322,516.

(51) Int. Cl.
| | |
|---|---|
| *H01L 21/76* | (2006.01) |
| *H01L 29/06* | (2006.01) |
| *H10B 43/27* | (2023.01) |
| *H01L 21/762* | (2006.01) |

(52) U.S. Cl.
CPC ....... *H10B 43/27* (2023.02); *H01L 21/76224* (2013.01); *H01L 29/0649* (2013.01)

(58) Field of Classification Search
CPC ................ H10B 43/27; H01L 29/0649; H01L 21/76224

USPC ......................................................... 257/120
See application file for complete search history.

(56) References Cited

U.S. PATENT DOCUMENTS

| | | | |
|---|---|---|---|
| 5,597,748 | A | 1/1997 | Asano et al. |
| 9,281,317 | B2 | 3/2016 | Higashitani et al. |
| 10,475,804 | B1 | 11/2019 | Nishikawa et al. |
| 10,685,978 | B1 | 6/2020 | Lu et al. |

(Continued)

FOREIGN PATENT DOCUMENTS

| | | |
|---|---|---|
| CN | 111146209 A | 5/2020 |
| CN | 111312716 A | 6/2020 |

OTHER PUBLICATIONS

Chinese First Office Action for Chinese Application No. 202111017950. 1, dated Oct. 10, 2022, 16 pages with translation.

(Continued)

*Primary Examiner* — Monica D Harrison
(74) *Attorney, Agent, or Firm* — TraskBritt

(57) ABSTRACT

Microelectronic devices include a stack structure comprising a vertically alternating sequence of insulative structures and conductive structures arranged in tiers. A series of pillars extends through the stack structure. At least one isolation structure extends through an upper stack portion of the stack structure. The at least one isolation structure protrudes into pillars of neighboring columns of pillars of the series of pillars. Conductive contacts are in electrical communication with the pillars into which the at least one isolation structure protrudes. Related methods and electronic systems are also disclosed.

20 Claims, 30 Drawing Sheets

(56) References Cited

U.S. PATENT DOCUMENTS

| | | | |
|---|---|---|---|
| 11,637,126 B2* | 4/2023 | Wu | ................... H01L 29/40111 257/295 |
| 2015/0214239 A1 | 7/2015 | Rhie | |
| 2016/0099254 A1 | 4/2016 | Park et al. | |

OTHER PUBLICATIONS

Hu et al., Microelectronic Devices Including Contact Structures, and Related Electronic Systems and Methods, U.S. Appl. No. 16/877,233, filed May 18, 2020.
Hu, Methods for Forming Electronic Apparatus with Tiered Stacks Having Conductive Structures Isolated by Trenches, and Related Electronic Apparatus and Systems, U.S. Appl. No. 16/877,209, filed May 18, 2020.

\* cited by examiner

MICROELECTRONIC DEVICES INCLUDING ISOLATION STRUCTURES PROTRUDING INTO UPPER PILLAR PORTIONS, AND RELATED METHODS AND SYSTEMS

CROSS-REFERENCE TO RELATED APPLICATION

This application is a continuation of U.S. patent application Ser. No. 17/007,951, filed Aug. 31, 2020, (now U.S. Pat. No. 11,322,516 issued May 3, 2022), the disclosure of which application is hereby incorporated in its entirety herein by this reference.

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having tiered stack structures that include vertically alternating conductive structures and insulative structures, to related systems, and to methods for forming such structures and devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as local access lines (e.g., local word lines) and gate structures (e.g., control gates) for the memory cells. Vertical structures (e.g., pillars comprising channel structures and tunneling structures) extend along and form portions of the memory cells of individual vertical strings of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

A continued goal in the microelectronic device fabrication industry is to increase the number of operational device features that may be formed within a given footprint of a microelectronic device structure without significantly negatively impacting other aspects of device design, fabrication, and operation. Therefore, designing and fabricating microelectronic devices, such as 3D NAND memory devices, continues to present challenges.

DETAILED DESCRIPTION

Figure 1:
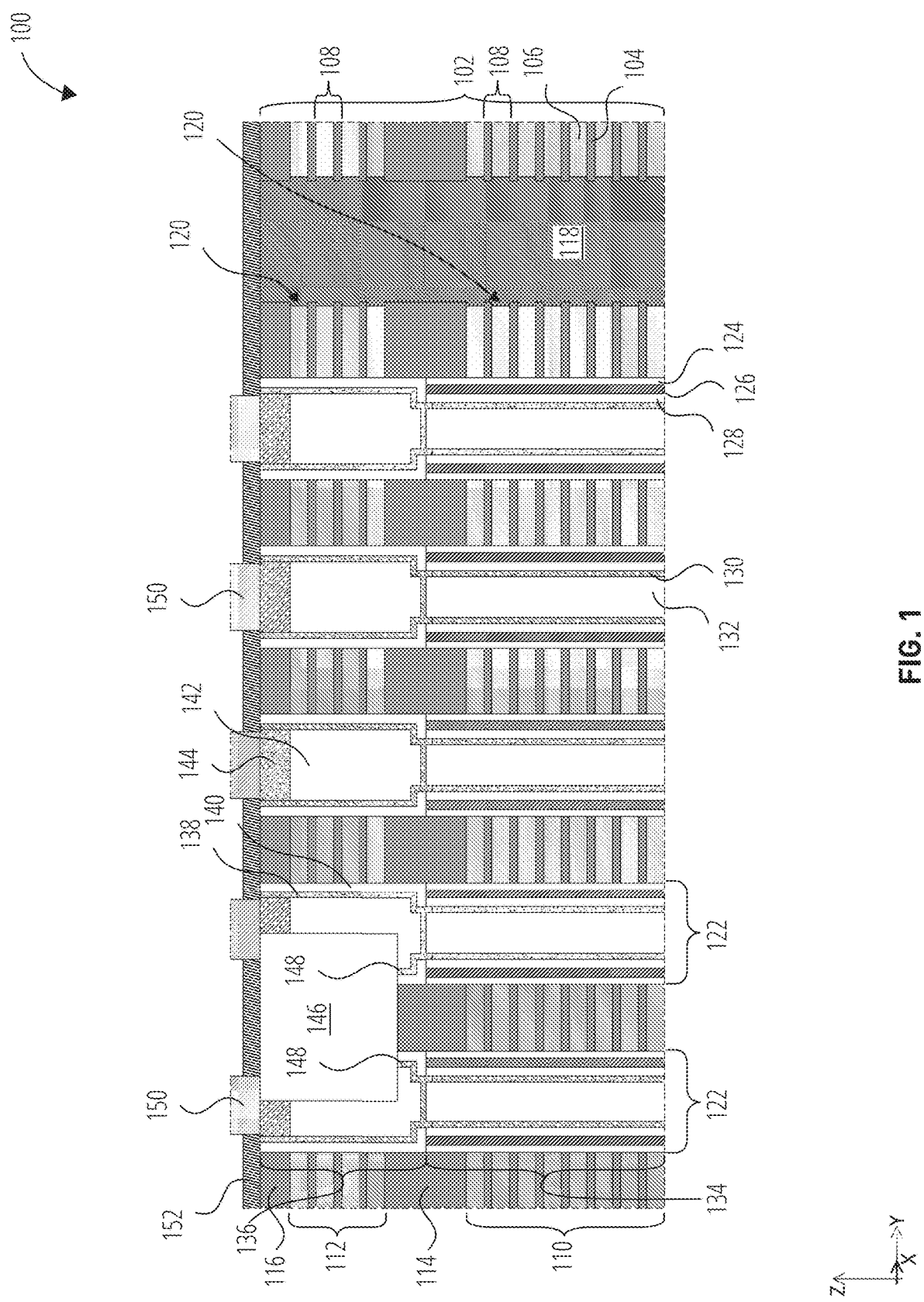
FIG. 1 is a cross-sectional, elevational, schematic illustration of a microelectronic device structure, in accordance with embodiments of the disclosure.

Structures (e.g., microelectronic device structures), apparatus (e.g., microelectronic devices), and systems (e.g., electronic systems), in accordance with embodiments of the disclosure, include a stack of vertically alternating conductive structures and insulative structures arranged in tiers, through which pillars vertically extend. One or more isolation trenches cut into an upper portion of at least some of the pillars, such that horizontal cross sectional areas of the upper pillar portions are less than horizontal cross sectional areas of lower portions of the pillars. The upper portions of such pillars are still able to function as portions of select gate devices (e.g., select gate drain (SGD) devices) devices during operation of an apparatus including the pillars. Isolation trenches may, therefore, be formed to cut into "active" pillars (e.g., pillars that are electrically operable during operation of the apparatus), which may eliminate the need for "dummy" pillars that may otherwise occupy valuable footprint area of the apparatus.

As used herein, the terms "opening," "trench," and "slit" mean and include a volume extending through at least one structure or at least one material, leaving a gap in that at least one structure or at least one material, or a volume extending between structures or materials, leaving a gap between the structures or materials. Unless otherwise described, an "opening," "trench," and/or "slit" is not necessarily empty of material. That is, an "opening," "trench," or "slit" is not necessarily void space. An "opening," "trench," or "slit" formed in or between structures or materials may comprise structure(s) or material(s) other than that in or between which the opening is formed. And, structure(s) or material(s) "exposed" within an opening, trench, or slit is (are) not necessarily in contact with an atmosphere or non-solid environment. Structure(s) or material(s) "exposed" within an opening, trench, or slit may be adjacent or in contact with other structure(s) or material(s) that is (are) disposed within the opening, trench, or slit.

As used herein, the terms "trench" and "slit" mean and include an elongate opening, while the term "opening" may include either or both an elongate opening and/or a non-elongate opening.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the term "insulative," when used in reference to a material or structure, means and includes a material or structure that is electrically insulating. An "insulative" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "sacrificial," when used in reference to a material or structure, means and includes a material or structure that is formed during a fabrication process but which is removed (e.g., substantially removed) prior to completion of the fabrication process.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis, may be parallel to an indicated "X" axis, and/or may be parallel to an indicated "Y" axis.

As used herein, the terms "vertical" or "longitudinal" mean and include a direction that is perpendicular to a primary surface of the substrate on which a referenced material or structure is located. The height of a respective material or structure may be defined as a dimension in a vertical plane. With reference to the figures, the "vertical" direction may be parallel to an indicated "Z" axis, may be perpendicular to an indicated "X" axis, and/or may be perpendicular to an indicated "Y" axis.

As used herein, the term "width" means and includes a dimension, along a horizontal plane (e.g., at a certain elevation, if identified), defining a maximum distance, along such plane, of the material or structure in question. For example, a "width" of a structure, that is at least partially hollow, is the horizontal dimension between outermost edges or sidewalls of the structure, such as an outer diameter for a hollow, cylindrical structure.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—means and includes the parameter, property, or condition of the two such structures, materials, features, or portions being equal, substantially equal, or about equal, at least in terms of respective dispositions of such structures, materials, features, or portions. For example, two structures having "consistent" thickness as one another may each define a same, substantially same, or about the same thickness at X vertical distance from a feature, despite the two structures being at different elevations along the feature. As another example, one structuring having a "consistent" width may have two portions that each define a same, substantially same, or about the same width at elevation Y1 of such structure as at elevation Y2 of such structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, a "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

With reference to FIG. 1, illustrated is a microelectronic device structure 100 that includes a stack structure 102 with insulative structures 104 vertically interleaved with conductive structures 106 arranged in tiers 108. Each of the tiers 108 may individually include a level of one of the insulative structures 104 directly vertically adjacent one or two levels of the conductive structures 106.

The insulative structures 104 may be formed of and include at least one electrically insulative material, such as one or more of the insulative material(s) discussed above (e.g., a dielectric oxide material, such as silicon dioxide). In this and other embodiments described herein, the insulative material(s) of the insulative structures 104 may be the same or different than other insulative material(s) of the microelectronic device structure (e.g., the microelectronic device structure 100 of FIG. 1).

The conductive structures 106 may be formed of and include electrically conductive material, such as at least one electrically conductive material (e.g., a metal (e.g., tungsten, titanium, nickel, platinum, rhodium, ruthenium, iridium, aluminum, copper, molybdenum, silver, gold), an alloy (e.g., an alloy of one or more of the aforementioned metals), a metal-containing material that includes one or more of the aforementioned metals (e.g., metal nitrides, metal silicides, metal carbides, metal oxides, such as a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof), a conductively-doped semiconductor material (e.g., conductively-doped silicon, conductively-doped germanium, conductively-doped silicon germanium, etc.), polysilicon, other materials exhibiting electrical conductivity, or combinations thereof). In some embodiments, the conductive structures 106 include at least one of the aforementioned electrically conductive material(s) along with at least one additional electrically conductive material formed as a liner. For example, the conductive structures 106 (e.g., of the lower stack 110, of the upper stack 112, and/or both) may include at least one of the aforementioned metals and a conductive liner comprising at least one of the aforementioned metal-containing materials. For example, some or all of the conductive structures 106 may include a conductive nitride liner (e.g., a tungsten nitride liner) with a conductive metal (e.g., tungsten) surrounded at least in part by the conductive nitride liner. The conductive liner may be directly adjacent the insulative structures 104. In other embodiments, the conductive structures 106 may consist essentially of or consist of one conductive material, or a homogenous combination of conductive materials, with the conductive material(s) directly adjacent and extending between vertically adjacent insulative structures 104, e.g., without a distinguishable conductive liner.

In a lower stack 110 of the stack structure 102, the conductive structures 106 may be configured as "replacement gate" word lines (e.g., word lines formed through so-called "replacement gate" or "gate last" processing). In some embodiments, a number (e.g., quantity) of the tiers 108 of the lower stack 110 may be within a range of from thirty-two of the tiers 108 to two-hundred fifty six of the tiers 108. In some embodiments, the lower stack 110 includes one-hundred twenty-eight of the tiers 108. However, the disclosure is not so limited, and the lower stack 110 may include a different number of the tiers 108.

In an upper stack 112 of the stack structure 102, the conductive structures 106 may comprise and be configured as so-called "select gate structures" (e.g., select gate drain (SGD) structures, select gate source (SGS) slit structures 118). Such conductive structures 106 of the upper stack 112 may be used for selecting memory cells of a particular string of memory cells. Although FIG. 1 illustrates four of the conductive structures 106 in the upper stack 112, the disclosure is not so limited. Any number of the conductive structures 106—such as fewer than four conductive structures 106 (e.g., one, two, three) or greater than four conductive structures 106 (e.g., five, six, seven, eight, or more) may be included in the upper stack 112.

At least one additional insulative structure 114 (e.g., one or more additional insulative structures 114) may be between (e.g., vertically between, directly vertically between) the lower stack 110 and the upper stack 112. The additional insulative structure 114 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the additional insulative structure 114 comprises the same material composition as the insulative material of the insulative structures 104. In other embodiments, the additional insulative structure 114 comprises a different material composition than the insulative material of the insulative structures 104. In some embodiments, the additional insulative structure 114 (e.g., a single additional insulative structure 114) is formed of and includes silicon dioxide. The additional insulative structure 114 may be formed to be thicker than some or all of the insulative structures 104, individually.

At least one upper insulative structure 116 (e.g., one or more upper insulative structures 116) may be disposed above the upper stack 112. The upper insulative structure 116 may be formed of and include any one or more of the insulative material(s) described above with respect to any of the insulative structures 104 and/or the additional insulative structure 114. In some embodiments, the upper insulative structure 116 comprises the same material composition as the insulative material of the insulative structures 104 and/or of the additional insulative structure 114. In other embodiments, the upper insulative structure 116 comprises a different material composition than the insulative material of any or all of the insulative structures 104 and/or the upper insulative structure 116. In some embodiments, the upper insulative structure 116 is formed of and includes silicon dioxide. The upper insulative structure 116 may be thicker than neighboring insulative structures 104 of the upper stack 112. The upper insulative structure 116 may be thinner than the additional insulative structure 114 (or the additional insulative structures 114, collectively).

In some embodiments, the stack structure 102 may be formed on, and may be supported by, one or more base structure(s), such as a source structure (e.g., a source plate), which may be formed of and include, for example, a semiconductor material doped with one of P-type conductivity materials (e.g., polysilicon doped with at least one P-type dopant (e.g., one or more of boron, aluminum, and gallium)) or N-type conductivity materials (e.g., polysilicon doped with at least one N-type dopant (e.g., one or more of arsenic, phosphorous, and antimony)). A lowest tier 108 of the lower stack 110 may be directly on the source structure, or the lower stack 110 may overlie a deck structure comprising additional tiers (e.g., additional levels of the tiers 108 of the insulative structures 104 and the conductive structures 106). Such additional deck(s) of tiers 108 may be separated from the lower stack 110 and from each other by one or more dielectric structure(s), such as one or more of the additional insulative structures 114.

Slit structures 118 extend through the stack structure 102, dividing the stack structure 102 into multiple "blocks," which are further discussed below. The slit structures 118 may comprise slits (e.g., slots, trenches, openings such as elongate openings) filled with one or more of the insulative material(s) previously described herein. For example, the slit structures 118 may be formed of and include one or more of phosphosilicate glass (PSG), borosilicate glass (BSG), fluorosilicate glass (FSG), borophosphosilicate glass (BPSG), and silicon dioxide. In some embodiments, the slit structures 118 comprise silicon dioxide.

In some embodiments, along the sidewalls of the slit structures 118, the conductive structures 106 may be recessed relative to their vertically neighboring insulative structures 104. For example, there may be recesses 120 laterally adjacent one or more ends of the conductive structures 106, and the slit structures 118 may laterally extend between ends of the insulative structures 104. In other embodiments, the ends of some or all of the insulative structures 104 may align with (e.g., be substantially coplanar with) the ends of some or all of the conductive structures 106.

Between neighboring slit structures 118, pillars 122 also extend through the stack structure 102. The pillars 122 may each individually comprise—in order from outermost material or structure to innermost material or structure, relative to an axial centerline of the pillar 122 as being innermost—a charge-blocking structure 124 (e.g., formed of and including a dielectric blocking material), a charge trap structure 126 (e.g., formed of and including at least one memory material), a tunnel dielectric structure 128 (e.g., formed of and including at least one insulative material), at least one channel material 130, and at least one pillar fill structure 132 (e.g., formed of and including at least one insulative material).

The charge-blocking structure 124 may be horizontally interposed between the charge trap structure 126 and the tiers 108 of the lower stack 110; the charge trap structure 126 may be horizontally interposed between the charge-blocking structure 124 and the tunnel dielectric structure 128; the tunnel dielectric structure 128 may be horizontally interposed between the charge trap structure 126 and the channel material 130; and the channel material 130 may be horizontally interposed between the tunnel dielectric structure 128 and the pillar fill structure 132. The pillar fill structure 132 may extend along a longitudinal axis of the pillar 122.

The pillar fill structure 132 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the pillar fill structure 132 comprises silicon dioxide.

The channel material 130 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 130 includes amorphous silicon or polysilicon. In some embodiments, the channel material 130 comprises a doped semiconductor material, and the channel material 130 may be formed as a "doped hollow channel" (DHC) structure.

The tunnel dielectric structure 128 may be formed of and include an insulative (e.g., dielectric) material through which charge tunneling may be performed under suitable electrical bias conditions, such as through hot-carrier injection or by Fowler-Nordheim tunneling induced charge transfer. By way of non-limiting example, the tunnel dielectric structure 128 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric structure 128 comprises silicon dioxide. In other embodiments, the tunnel dielectric structure 128 comprises silicon oxynitride.

The charge trap structure 126 comprises at least one memory material, such as one or more charge-trapping materials and/or one or more conductive materials. The charge trap structure 126 may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material (e.g., polycrystalline or amorphous semiconductor material, including at least one elemental semiconductor element and/or including at least one compound semiconductor material, such as conductive nanoparticles (e.g., ruthenium nanoparticles) and/or metal dots). In some embodiments, the charge trap structure 126 comprises silicon nitride.

The charge-blocking structure 124 may be formed of and include an insulative (e.g., dielectric) material such as, for example, one or more of an oxide (e.g., silicon dioxide), a nitride (silicon nitride), and an oxynitride (silicon oxynitride), or another material. In some embodiments, the charge-blocking structure 124 comprises silicon oxynitride.

In some embodiments the tunnel dielectric structure 128, the charge trap structure 126, and the charge-blocking structure 124 together may comprise a structure configured to trap a charge, such as, for example, an oxide-nitride-oxide (ONO) structure. In some such embodiments, the tunnel dielectric structure 128 comprises silicon dioxide, the charge trap structure 126 comprises silicon nitride, and the charge-blocking structure 124 comprises silicon dioxide.

The above-described structures and materials of the pillars 122 may be the structures and materials of a lower pillar portion 134 of the pillars 122, which lower pillar portion 134 extends through the tiers 108 of the lower stack 110 and, in some embodiments, extends partly through the additional insulative structure 114. Memory cells may be located at intersections of the channel material 130 and the conductive structures 106 of the tiers 108 of the lower stack 110. Accordingly, the lower pillar portions 134 of the pillars 122, together with the conductive structures 106 of the lower stack 110, provide strings of memory cells vertically, or substantially vertically, extending through a portion of the stack structure 102. Vertically adjacent memory cells of the strings may be separated from each other by one of the levels of the insulative structures 104.

The pillars 122 may also, individually, include an upper pillar portion 136 that extends through the upper stack 112 and, in some embodiments, at least partly through the additional insulative structure 114 and the upper insulative structure 116. In the upper pillar portion 136, the pillars 122 include additional channel material 138 that is in physical contact with the channel material 130 of the lower pillar portion 134. The additional channel material 138 may be formed of and comprise any one or more of the channel materials described above with respect to the channel material 130 of the lower pillar portion 134. In some embodiments, the material composition of the additional channel material 138 may be the same as that of the channel material 130. In other embodiments, the material compositions may differ.

The additional channel material 138 may be spaced from the tiers 108 of the upper stack 112 by one or more insulative structures or materials, such as a gate oxide 140. The additional channel material 138 extends through the gate oxide 140 along a base of the upper pillar portion 136 to make physical contact with the channel material 130.

An innermost volume of the upper pillar portion 136 may be filled with an upper pillar fill structure 142, which may be formed of and include any one or more of the above-described insulative material(s). In some embodiments, the material composition of the upper pillar fill structure 142 may be the same as the material composition of the pillar fill structure 132. In other embodiments, the material compositions may differ.

In some embodiments, the additional channel material 138 is disposed above (e.g., directly above) both the channel material 130 and the pillar fill structure 132 of the lower pillar portion 134. Therefore, the additional channel material 138 may space the pillar fill structure 132 from the upper pillar fill structure 142. In other embodiments, the additional channel material 138 may not extend fully across the pillar fill structure 132.

A plug structure 144 may be formed above the upper pillar fill structure 142 to occupy at least an uppermost part of the upper pillar portion 136 of the pillar 122. In some embodiments, a lower surface of the plug structure 144 may be substantially coplanar with an upper surface of the upper stack 112 and with a lower surface of the upper insulative structure 116. The plug structure 144 may be formed of and include, e.g., a conductive polysilicon material (e.g., a doped polysilicon material). The plug structure 144 may be spaced from the upper insulative structure 116 by portions of the additional channel material 138 and the gate oxide 140.

Isolation structures 146 also extend through the upper stack 112 of the stack structure 102. Each isolation structure 146 effectively electrically isolates the conductive structures 106 of the tiers 108 of the upper stack 112 to one lateral side of the isolation structure 146 from the conductive structures 106 of the tiers 108 of the upper stack 112 to the other lateral side of the isolation structure 146. Accordingly, the isolation structures 146 partially define the select gate structures (e.g., the SGDs).

At least one of the isolation structures 146 is formed to effectively cut into (e.g., through) the materials and structures of the upper pillar portions 136 of horizontally neighboring pillars 122. Therefore, the cut-into upper pillar portions 136 have a lesser horizontal cross-sectional area than the horizontal cross-sectional area of their respective lower pillar portions 134. However, whether cut by one of the isolation structures 146 or not cut, a sidewall of the upper pillar portion 136 may be coplanar with a sidewall of the lower pillar portion 134 of the pillar 122.

The isolation structures 146 may individually be filled with one or more insulative material(s). In some embodiments, the isolation structure 146 may be formed of and include, e.g., one or more of phosphosilicate glass (PSG), borosilicate glass (BSG), fluorosilicate glass (FSG), borophosphosilicate glass (BPSG), and silicon dioxide. In some embodiments, the isolation structure 146 is formed of and includes silicon dioxide. In some embodiments, a liner is interposed between the rest of the isolation structure 146 and the neighboring materials or structures of the upper pillar portion 136 of the pillars 122.

Each isolation structure 146 extends at least through the upper stack 112 and into the additional insulative structure 114, such that a lower surface of the isolation structure 146 may be at a level within the additional insulative structure 114. The isolation structure 146 also extends into the materials and structures of the upper pillar portion 136 of the neighboring pillars 122 such that the horizontal cross-sectional area of the upper pillar portion 136 of each of the cut-into pillars 122 is less than the horizontal cross-sectional area of the upper pillar portions 136 of pillars 122 that are not at least partially interrupted by one of the isolation structures 146.

At least a portion of the sidewalls of the isolation structure 146 may be bordered by, in some embodiments, the plug structure 144 and the upper pillar fill structure 142. A lower surface of the isolation structure 146 may be bordered by, at least in part, the upper pillar fill structure 142, the gate oxide 140, and the additional insulative structure 114. In some embodiments, the lower surface of the isolation structure 146 may also come into contact with the additional channel material 138 vertically adjacent the isolation structure 146. In other embodiments, the additional channel material 138 may have been effectively recessed, prior to formation of the isolation structure 146, with another material (e.g., an insulative material) formed to fill the recess such that the isolation structure 146 may be spaced from the additional channel material 138 by one or more channel spacers 148.

Unexpectedly, even the pillars 122 that have the isolation structure 146 cutting into their upper pillar portions 136 may be configured as, and function as, "active" pillars of the microelectronic device structure 100. That is, a select gate structure device (e.g., an SGD) with a partial-circle (e.g., half-circle, or about half-circle) cross-sectional area may be substantially as effective as a select gate structure device with a whole-circle cross-sectional area. For example, unexpectedly, the current and threshold voltage (Vt) of the select gate structure devices may be substantially the same whether having a whole-circle cross-sectional area or an about half-circle cross-sectional area. Therefore, the isolation structures 146 may be formed to cut into pillars 122 without those pillars 122 having to be "dummy" (e.g., functionally inoperable) pillars. Because isolation-trench-accommodating "dummy" pillars may be eliminated, the reclaimed footprint of the pillar-array-including portion of the microelectronic device structure 100 may be saved for additional "active" pillars, adding to the number of active pillars in the pillar array. Alternatively, the footprint that would have otherwise been occupied by "dummy" pillars may be eliminated, so as to reduce the overall footprint of the pillar array portion of the microelectronic device structure 100. Accordingly, the formation of the isolation structures 146 through active pillars 122 enables either a greater number of active pillars 122 in the pillar array (e.g., laterally between neighboring slit structures 118) or a smaller lateral distance occupied by the pillar array (e.g., a smaller lateral distance between neighboring slit structures 118).

While the pillars 122 cut into by the isolation structures 146 may be active, rather than "dummy" pillars, in some embodiments other portions of the pillar array may nonetheless include "dummy" pillars.

The microelectronic device structure 100 may also include, above the pillars 122, conductive contacts 150 at least partially above and in contact with the plug structures 144 of the pillars 122. The conductive contacts 150 may extend vertically through or otherwise be laterally adjacent a dielectric structure 152 comprising one or more insulative material(s). The conductive contacts 150 may provide electrical communication between the pillars 122 and conductive lines of the microelectronic device structure 100, such as access lines (e.g., bit lines, digit lines). In some embodiments, the conductive contacts 150 on the plug structures 144 of the full-circle upper pillar portions 136 (e.g., the pillars 122 not cut into by the isolation structures 146) may be of about the same dimension and shape as the conductive contacts 150 on the plug structures 144 of the partial-circle upper pillar portions 136 (e.g., the pillars 122 cut into by the isolation structure 146). In other embodiments, the conductive contacts 150 on the partial-circle upper pillar portions 136 may be of a smaller dimension than those on the full-circle upper pillar portions 136.

The amount of the upper pillar portions 136 that are cut into, and therefore displaced, by the isolation structures 146 may depend upon the shape at which the isolation structures 146 are formed. For example, with reference to FIG. 2, in some embodiments the isolation structures 146 may be formed as substantially straight parallel structures with substantially planar sidewalls (e.g., vertical or somewhat slanted sidewalls). Accordingly, a microelectronic device structure 200 such as that illustrated in FIG. 2—wherein the microelectronic device structures 100 of FIG. 1 may be included and represent a view along section line 202 (the conductive contacts 150 and the dielectric structure 152 of FIG. 1 not being illustrated, for ease of view of the pillar array)—may include a block 204 between a neighboring pair of slit structures 118 with multiple (e.g., three) isolation structures 146, each of the isolation structures 146 cutting into and passing along a pair of neighboring columns of the pillars 122.

Figure 2:
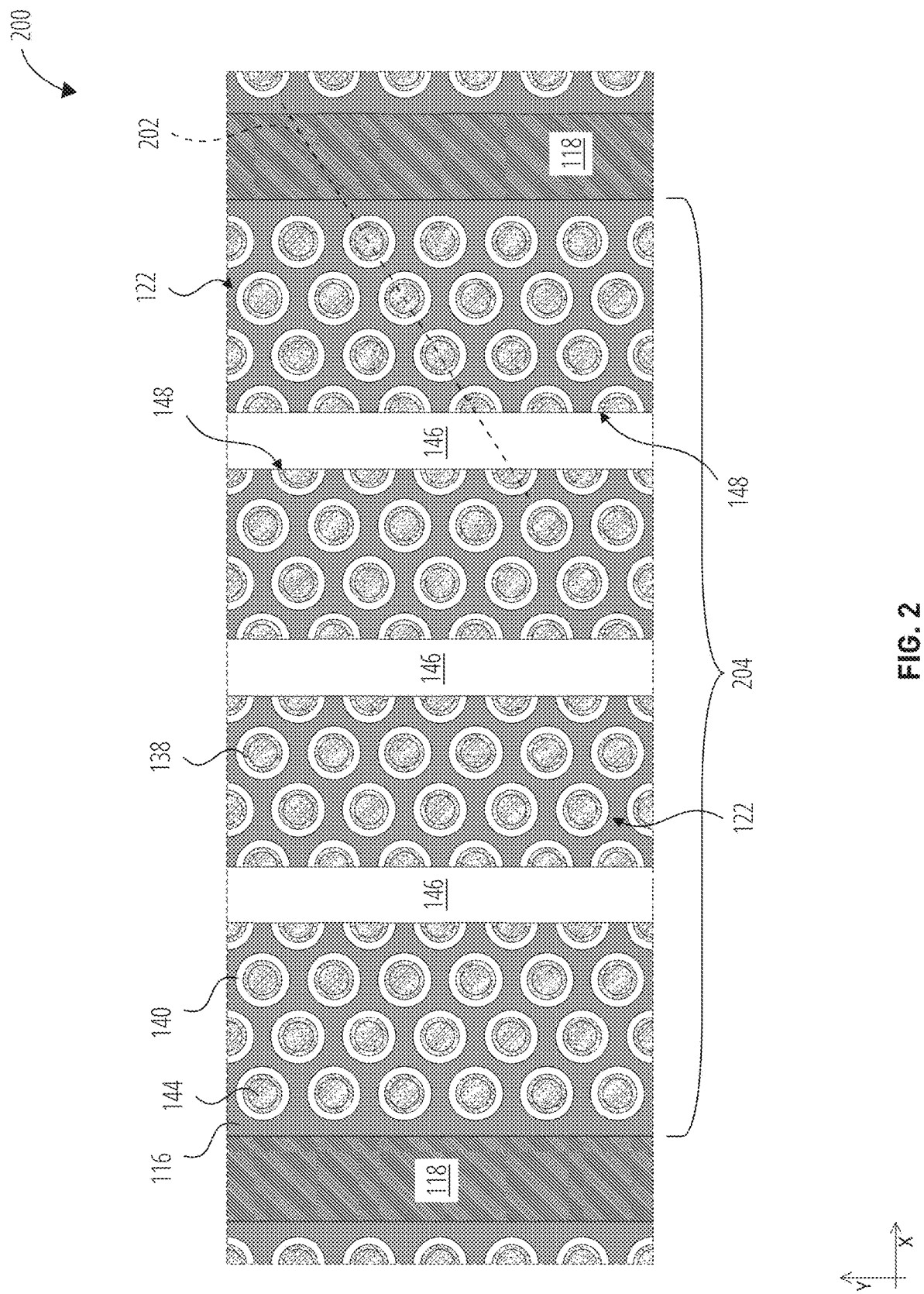
FIG. 2 is a top plan, schematic illustration of a microelectronic device structure, which may include the microelectronic device structure of FIG. 1, in accordance with embodiments of the disclosure—without showing conductive contacts and a dielectric structure, for ease of illustration—wherein the microelectronic device structure of FIG. 1 may be a view along section line 202 of FIG. 2, and isolation trenches are formed as substantially-straight parallel structures.

The block 204 of FIG. 2 includes, for example, sixteen pillars 122 (e.g., active pillars) along a width of the block 204 between the slit structures 118, counting the pillars 122 of a pair of offset rows of the pillars 122. Accordingly, four full-circular or substantially half-circular (e.g., semi-circular) pillars 122 (e.g., upper pillar portions 136 (FIG. 1)) are disposed between neighboring isolation structures 146 and between an outermost isolation structure 146 and its neighboring slit structure 118. However, the number of pillars 122 of the block 204 may be otherwise tailored as desired, such as with fewer than sixteen pillars 122 or with more than sixteen pillars 122. Each of the pillars 122 between the slit structures 118 may be "active" pillars 122, at least in portions of the pillar array that are containing active pillars. In some such embodiments, for examples, pillars along the upper and lower edges of the pillar array may be configured as "dummy" pillars, nonetheless.

The substantially straight sidewalls of the substantially straight isolation structures 146 may be bordered by the plug structures 144 and the gate oxide 140, with the channel spacers 148 interposed between the isolation structures 146 and the additional channel material 138. The upper insulative structure 116 also borders that part of the sidewalls of the isolation structures 146 that extend between neighboring pillars 122 of a column of pillars.

Figure 3:
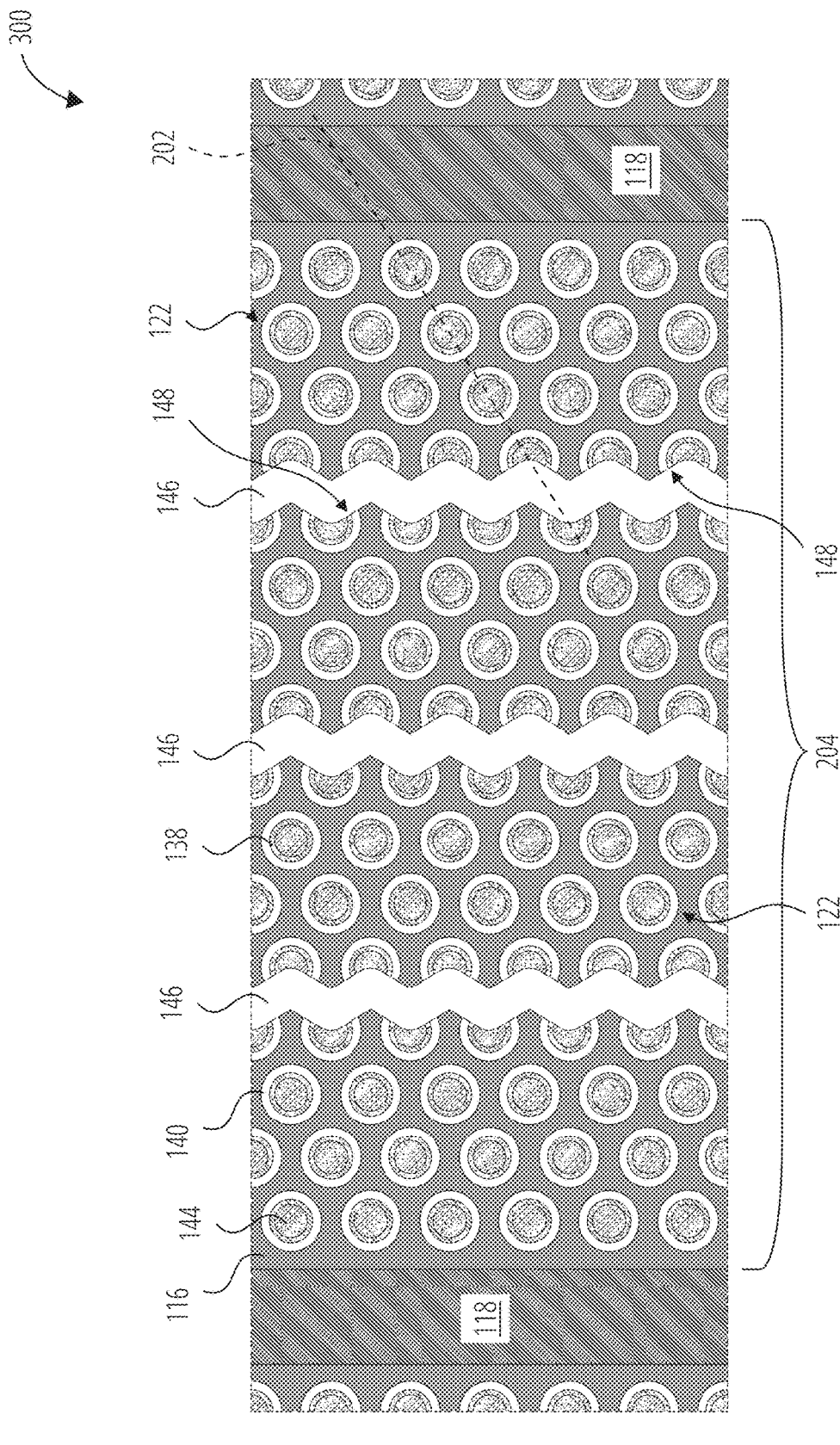
FIG. 3 is a top plan, schematic illustration of a microelectronic device structure, which may include the microelectronic device structure of FIG. 1, in accordance with embodiments of the disclosure—without showing conductive contacts and a dielectric structure, for ease of illustration—wherein the microelectronic device structure of FIG. 1 may be a view along section line 202 of FIG. 3, and isolation trenches are formed as wave-shaped structures.

With reference to FIG. 3, illustrated is a microelectronic device structure 300 that includes "wave"-shaped isolation structures 146, wherein sidewalls of the isolation structures 146 are nonplanar. As with the microelectronic device structure 200 of FIG. 2, the microelectronic device structure 300 of FIG. 3 may include the microelectronic device structure 100 of FIG. 1 (without the conductive contacts 150 or the dielectric structure 152 illustrated, for ease of illustration), with the view of FIG. 1 being taken along section line 202 of FIG. 3.

With the "wave" shape for the isolation structures 146, the nonplanar sidewalls of the isolation structures 146 define a horizontal, cross-sectional periphery (e.g., in the X-Y plane) that is not substantially straight. By forming the isolation structures 146 with the "wave"-shape, a greater portion of the circular horizontal cross-sectional area of the additional channel material 138 may remain in the pillars 122 (e.g., in the upper pillar portion 136 (FIG. 1)). The greater amount of the additional channel material 138 in the cut-into pillars 122 may enable the cut-into pillars 122 to function even more closely to that of the non-cut pillars 122 with whole-circle cross-section additional channel material 138.

The isolation structures 146 of the wave shape, like the isolation structures 146 of any other shape, may also be spaced from the additional channel material 138 by channel spacers 148. The spacing by the channel spacers 148 may give a sufficient metal-gate wrap disposition to enable the additional channel material 138 (e.g., the DHC structure of the pillars 122) to be better controlled (e.g., provide a better edge control). Alternatively, in other embodiments, the isolation structures 146 may be in direct contact with the additional channel material 138, regardless of the isolation structures 146 shape.

The particular shape of each of the isolation structures 146, in accordance with any of the embodiments of the disclosure, may be selected from any of a number of different shapes, including the substantially straight shapes of the isolation structures 146 of FIG. 2 and the wave shapes of the isolation structures 146 of FIG. 3. In some embodiments, the block 204 may include one or more isolation structures 146 of one shape (e.g., the substantially-straight shape of FIG. 2) and one or more other isolation structures 146 of one or more other shapes (e.g., the wave shape of FIG. 3).

Accordingly, disclosed is a microelectronic device comprising a stack structure comprising a vertically alternating sequence of insulative structures and conductive structures arranged in tiers. A series of pillars extends through the stack structure. At least one isolation structure extends through an upper stack portion of the stack structure. The at least one isolation structure protrudes into pillars of neighboring columns of pillars of the series of pillars. Conductive contacts are in electrical communication with the pillars into which the at least one isolation structure protrudes.

FIG. 4 through FIG. 17 illustrate various stages of processing to fabricate the microelectronic device structure 100 of FIG. 1, the microelectronic device structure 200 of FIG. 2, and/or the microelectronic device structure 300 of FIG. 3, wherein the cross-sectional views of FIG. 4 through FIG. 17 correspond to views along section line 202 of FIG. 2 and/or FIG. 3.

Figure 4:
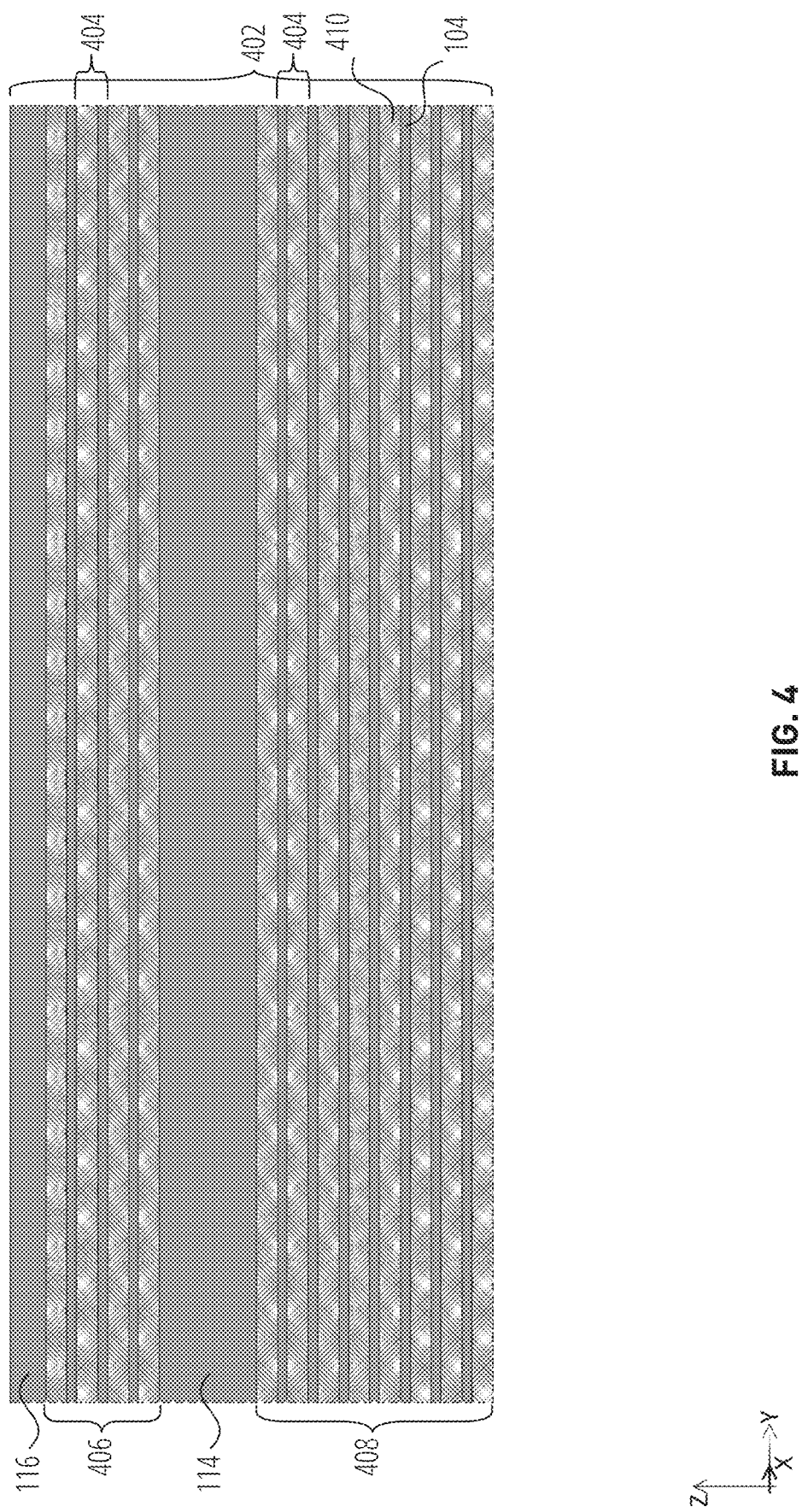
FIG. 4 through FIG. 17 are cross-sectional, elevational, schematic illustrations during various stages of processing to fabricate a microelectronic device structure, such as the microelectronic device structures of any of FIG. 1 through FIG. 3, in accordance with the embodiments of the disclosure.

With reference to FIG. 4, a stack structure 402 may be formed, with tiers 404 in an upper stack 406 and in a lower stack 408, by forming (e.g., depositing) materials of the insulative structures 104 alternating with one or more sacrificial material(s) of sacrificial structures 410 that will subsequently become the conductive structures 106 (FIG. 1). More particularly, after forming the tiers 404 of the lower stack 408, the additional insulative structure 114 may be formed (e.g., deposited) on or over the lower stack 408, then the tiers 404 of the upper stack 406 may be formed on or over the additional insulative structure 114, and then the upper insulative structure 116 may be formed on or over the upper stack 406.

The levels of the sacrificial structures 410 may be formed of and include, as one or more sacrificial material(s), insulative material(s) different than, and exhibiting etch selectivity with respect to, the insulative material(s) of the insulative structures 104. The sacrificial structures 410 may be selectively etchable relative to the insulative structures 104 during common (e.g., collective, mutual) exposure to a first etchant; and the insulative structures 104 may be selectively etchable relative to the sacrificial structures 410 during common exposure to a second, different etchant. As used herein, a first material is "selectively etchable" relative to a second material if the first material exhibits an etch rate that is at least about five times (5×) greater than the etch rate of the second material, such as about ten times (10×) greater, about twenty times (20×) greater, or about forty times (40×) greater. In some embodiments, the sacrificial structures 410 are formed of and include one or more of a dielectric nitride material (e.g., silicon nitride ($Si_3N_4$)) and a dielectric oxynitride material (e.g., silicon oxynitride). In some embodiments, the sacrificial structures 410 comprise silicon nitride and the insulative structures 104 comprise silicon dioxide.

When forming the additional insulative structure 114, it may be formed to a thickness providing a sufficient processing margin for subsequently etching trenches for the isolation structures 146 without etching those trenches into the materials and structures of the lower pillar portions 134 (FIG. 1) of the pillars 122 (FIG. 1).

Figure 5:
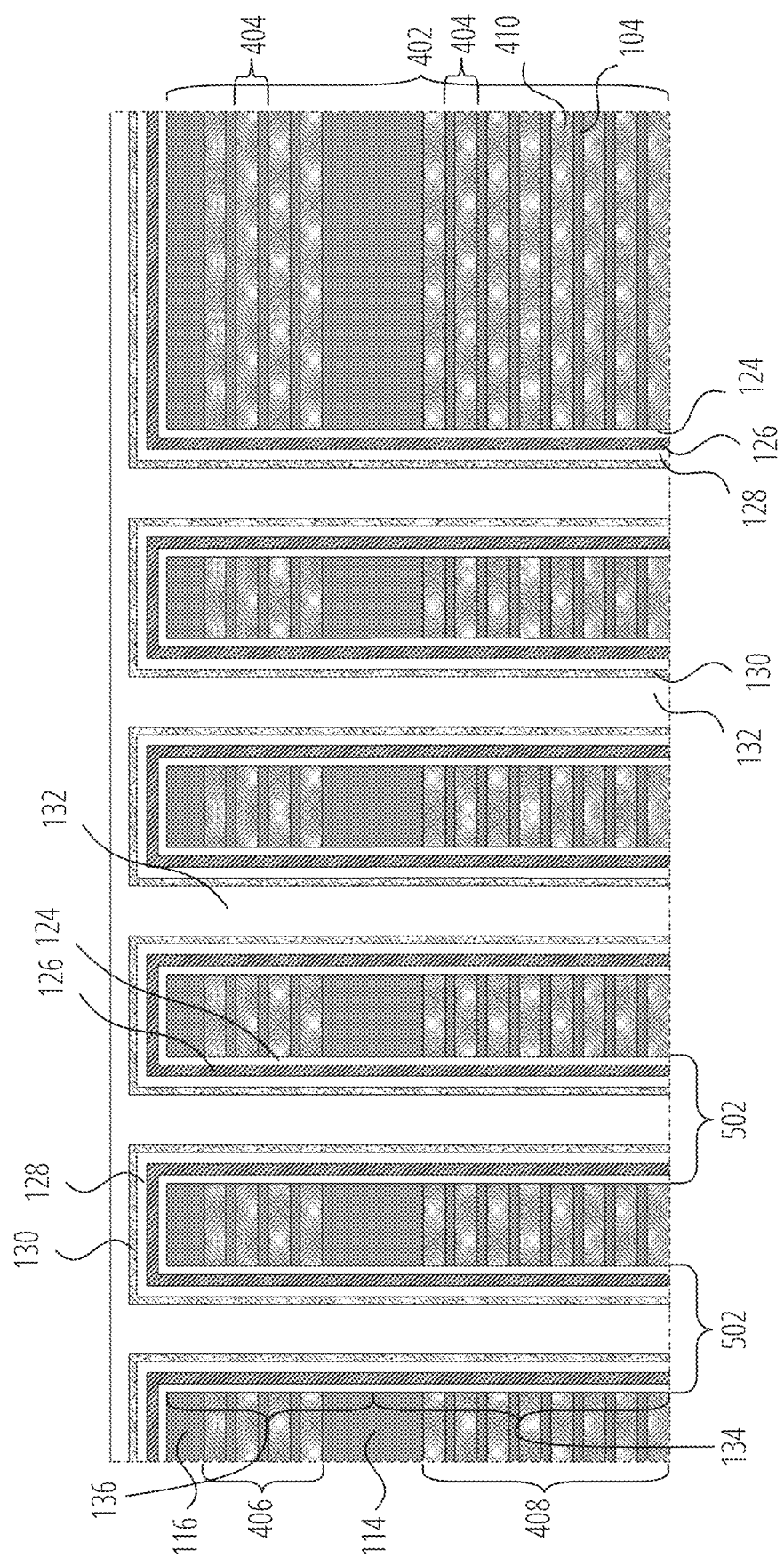

After forming the stack structure 402, openings (e.g., cylindrical openings with substantially circular cross-sectional areas) may be formed through the stack structure 402 according to the arrangement the pillars 122 (FIG. 1) are to occupy in the pillar array. With reference to FIG. 5, both the openings formed in pillar areas 502 may extend fully and consistently through both the upper stack 406 and the lower stack 408, as well as through the upper insulative structure 116 and the additional insulative structure 114 so that sidewall(s) defining the openings in the pillar areas 502 are substantially straight and with a substantially consistent horizontal cross-sectional areal along a height of the pillar areas 502. Accordingly, an opening for the lower pillar portion 134 may be formed in the same material-removal process as that in which an opening for the upper pillar portion 136 is formed.

The materials of at least the lower pillar portions 134 of the pillars 122 may then be formed in the openings formed in the pillar areas 502, such as by forming (e.g., depositing) the materials of the lower pillar portion 134 in order from outermost material to innermost material. For example, the charge-blocking structure 124 may be formed (e.g., conformally deposited) on all exposed surfaces in the pillar openings of the pillar areas 502, the charge trap structure 126 may be formed (e.g., conformally deposited) on all exposed surfaces of the charge-blocking structure 124, the tunnel dielectric structure 128 may be formed (e.g., conformally deposited) on all exposed surface of the charge trap structure 126, the channel material 130 may be formed (e.g., conformally deposited) on all exposed surfaces of the tunnel dielectric structure 128, and the material(s) of the pillar fill structure 132 may be formed (e.g., conformally deposited) on all exposed surfaces of the channel material 130. These materials may be formed not only in the pillar areas 502 but also above an upper surface of the upper insulative structure 116, in some embodiments.

Figure 6:
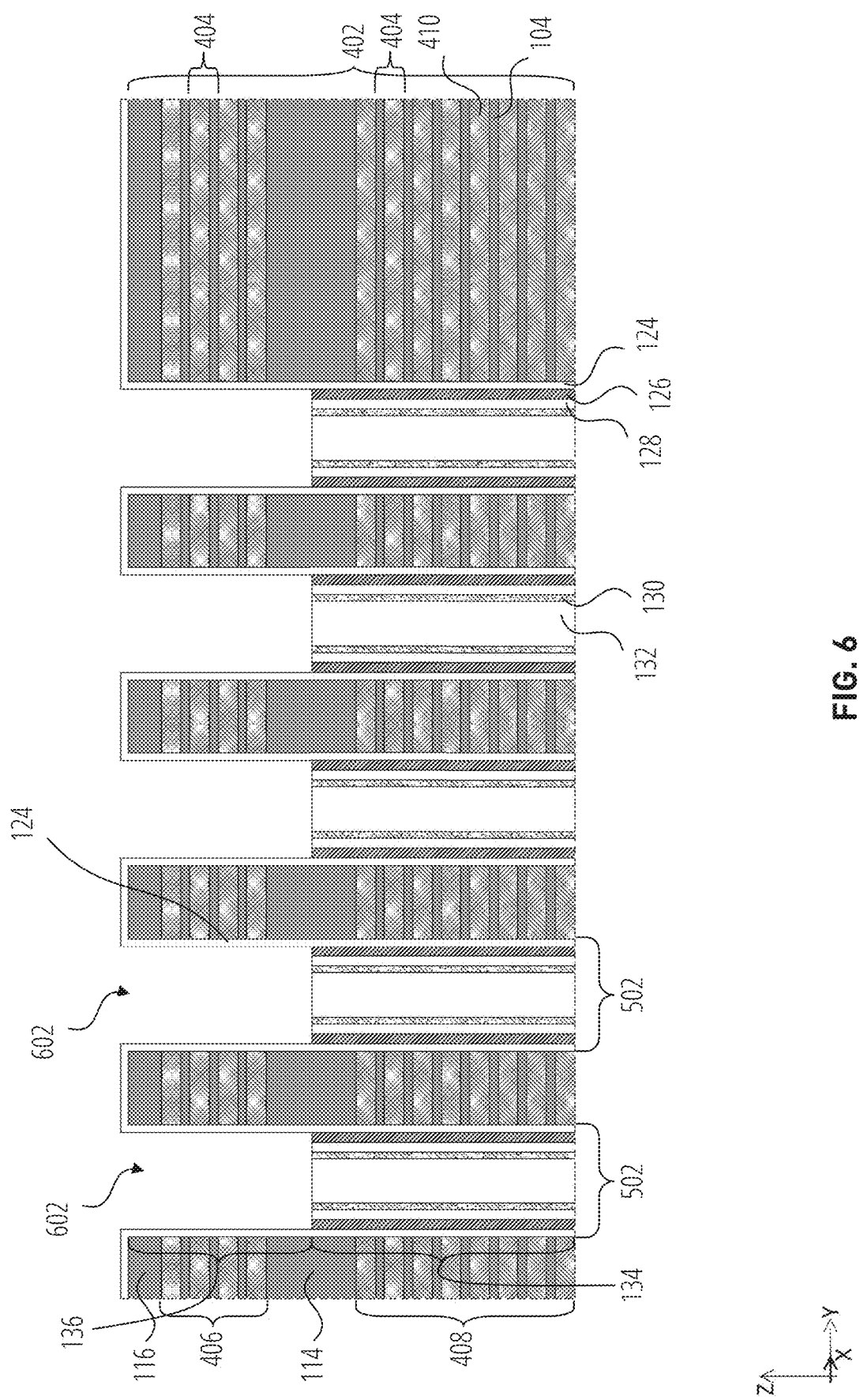

With reference to FIG. 6, one or more material-removal acts (e.g., wet or vapor etching acts) may be performed, in sequence, to recess at least the pillar fill structure 132, the channel material 130, the tunnel dielectric structure 128, and the charge trap structure 126 so that an upper surface of each is at level(s) within the height of the additional insulative structure 114, to define recesses 602 in what will become the upper pillar portions 136. In some embodiments, as a result of forming the recesses 602, the upper surfaces of the pillar fill structure 132, the channel material 130, the tunnel dielectric structure 128, and the charge trap structure 126 are substantially coplanar. In other embodiments, one or more of the pillar fill structure 132, the channel material 130, the tunnel dielectric structure 128, and/or the charge trap structure 126 are further recessed relative to the others. For example, the channel material 130 may extend somewhat above or may recess somewhat below the upper surface of the tunnel dielectric structure 128 and/or the pillar fill structure 132.

Figure 7:
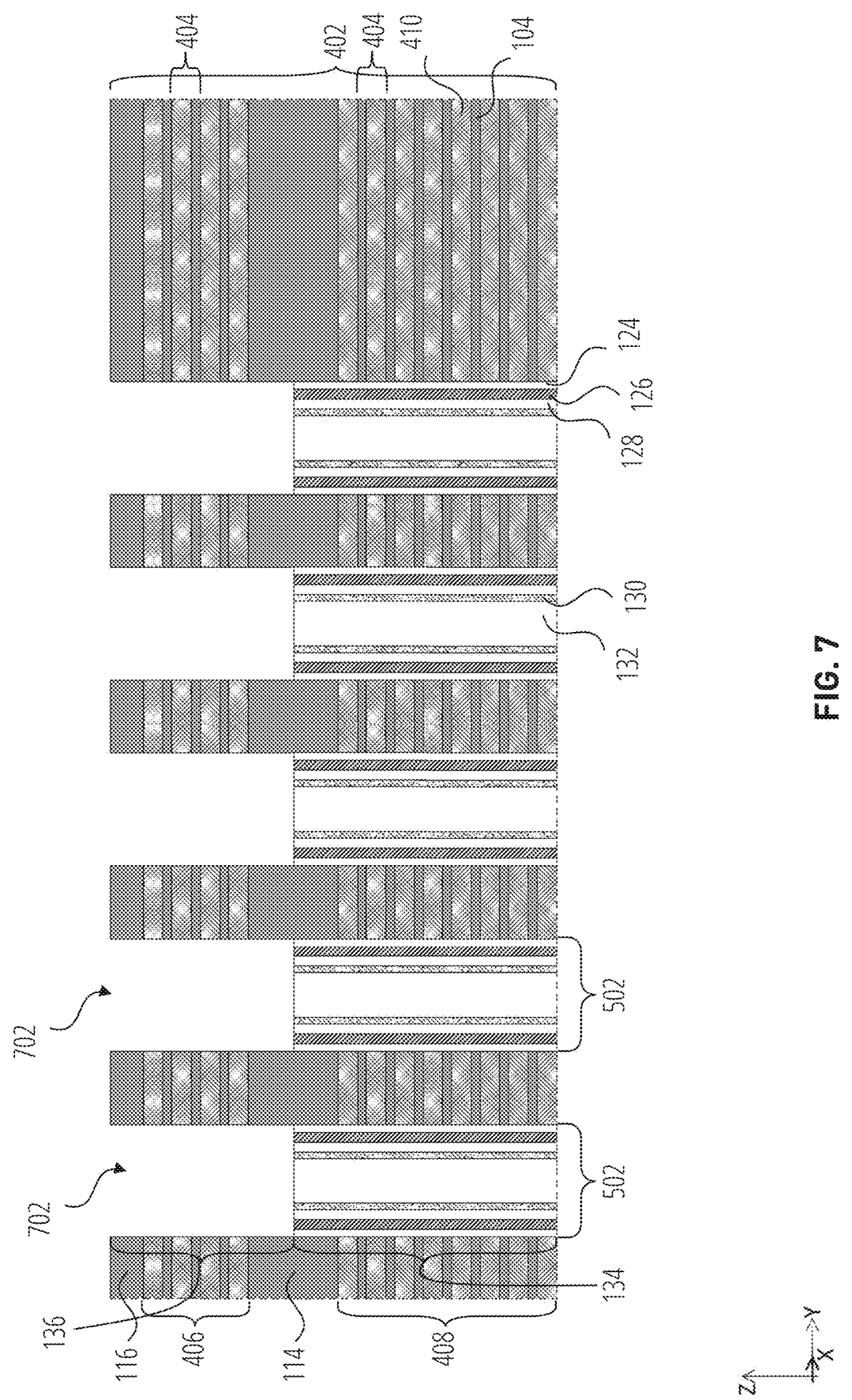

In some embodiments, the charge-blocking structure 124 is also recessed from the upper pillar portions 136, as illustrated in FIG. 7, leaving recesses 702 that expose sidewalls of the tiers 404 of the upper stack 406. For example, another material-removal act (e.g., wet or vapor etch) may be performed to remove the charge-blocking structure 124 (FIG. 6) from above the upper insulative structure 116 and from sidewalls along the upper pillar portions 136 in the pillar areas 502.

Figure 8:
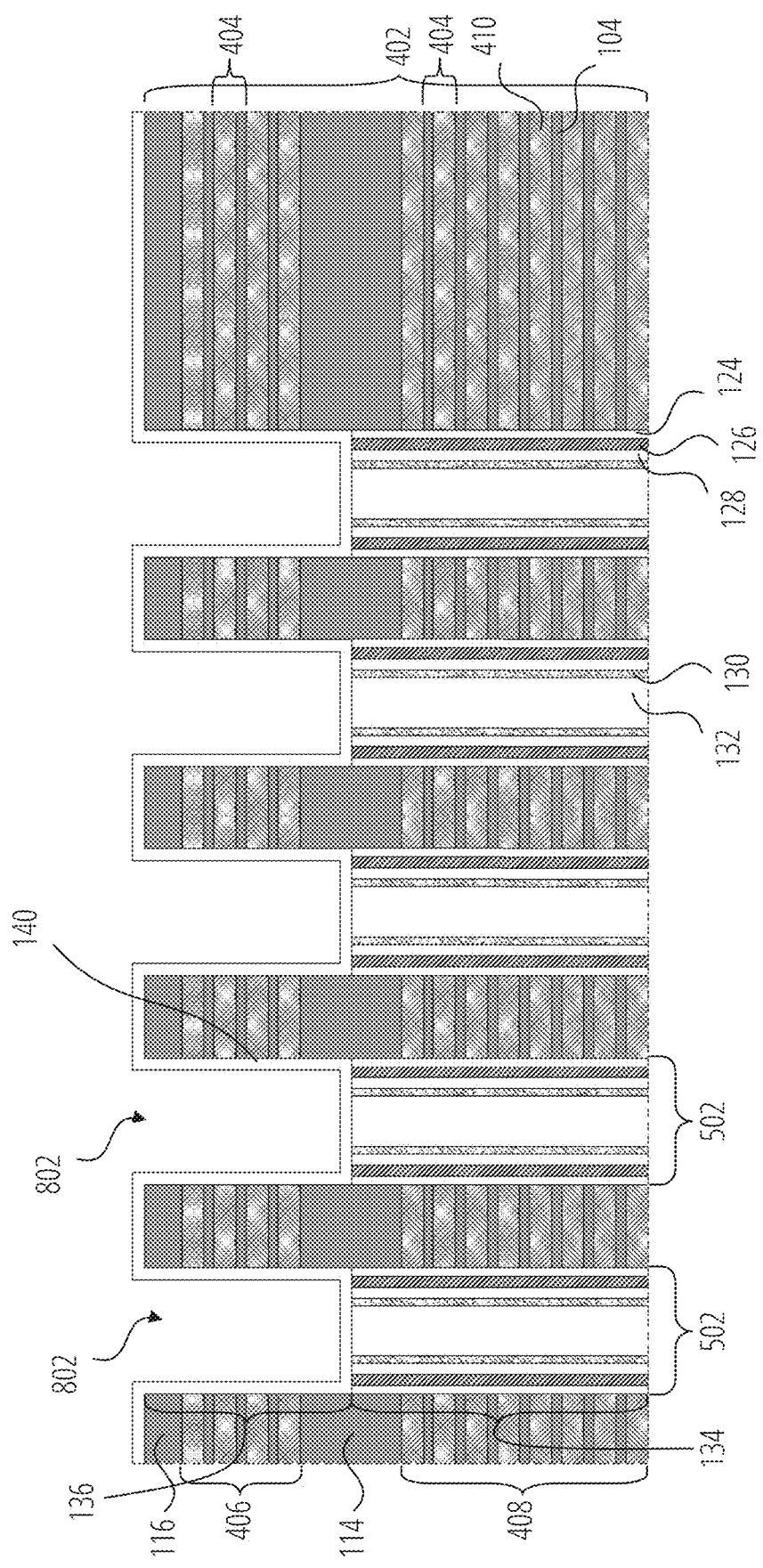

With reference to FIG. 8, the gate oxide 140 may then be formed (e.g., conformally deposited) to line surfaces defining the recesses 702 (FIG. 7) and form openings 802 in the upper pillar portions 136.

Figure 9:
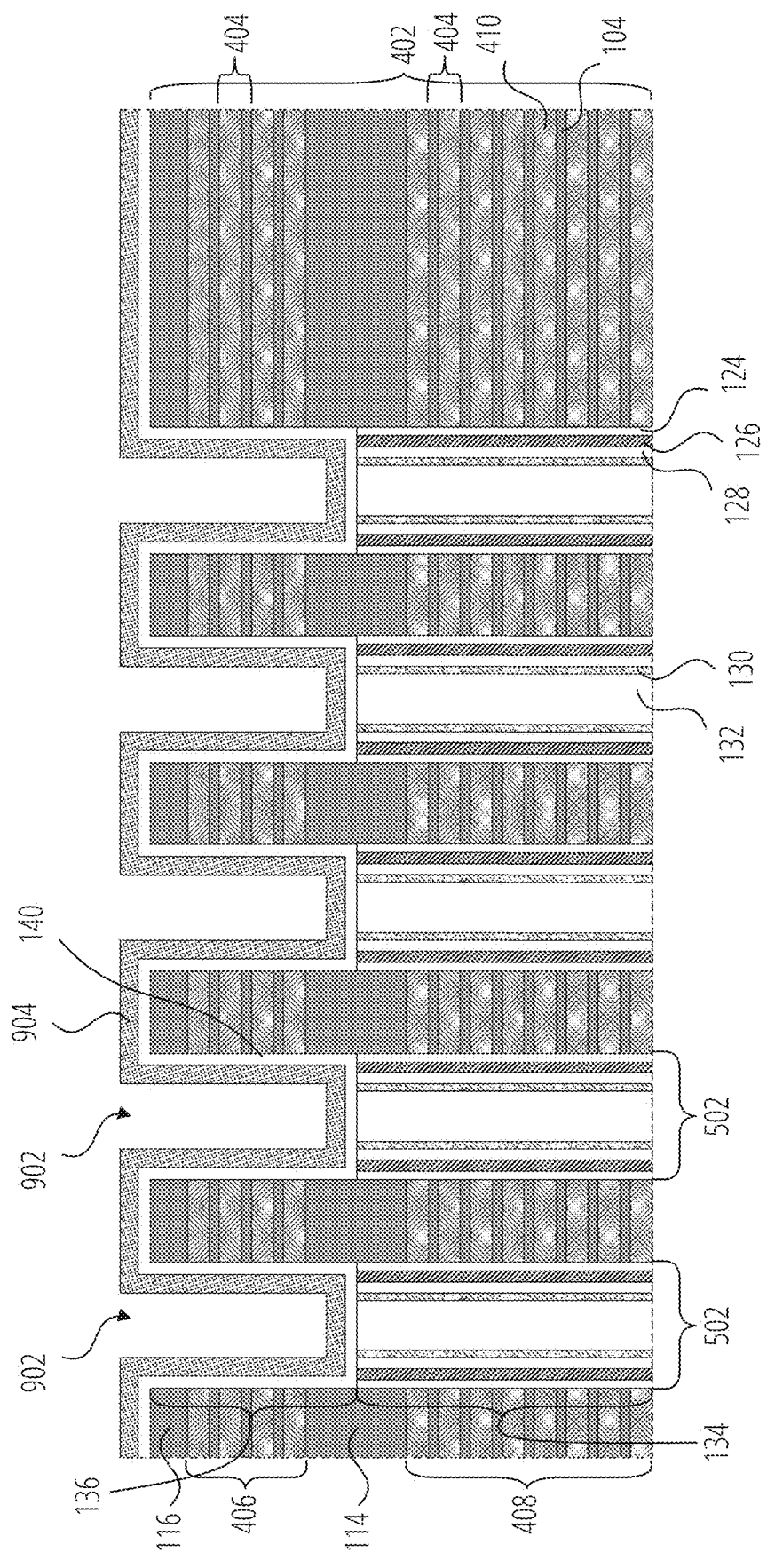

With reference to FIG. 9, openings 902 may be formed by forming (e.g., depositing) a sacrificial liner 904 on (e.g., directly on) the gate oxide 140. The sacrificial liner 904 may be formed of and include any one or more of the sacrificial materials described above. In some embodiments, the sacrificial liner 904 may be formed of and include, e.g., a polysilicon material and/or a nitride material. The sacrificial liner 904 may be formed to a thickness from the gate oxide 140 of about 10 nm, such that at least the portions of the sacrificial liner 904 on sidewalls along the openings 902 are thick enough that the charge trap structure 126 is wholly overlapped by one or both of the gate oxide 140 and the sacrificial liner 904, and not by the empty space of the openings 902.

Figure 10:
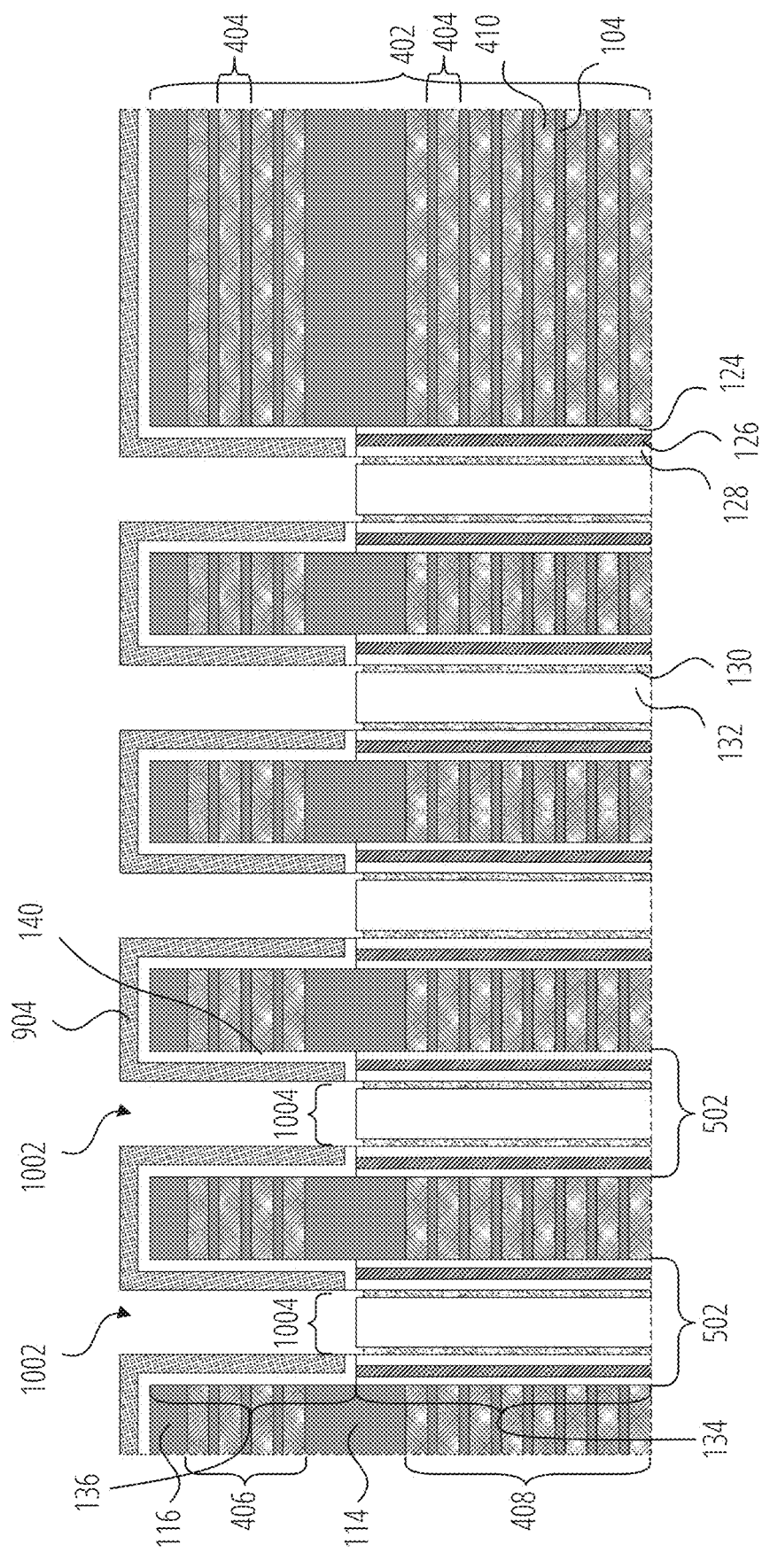

With reference to FIG. 10, openings 1002 may then be formed by removing a base portion 1004 of each of the sacrificial liner 904 and the gate oxide 140, in one or more material-removal acts (e.g., anisotropic etching acts) to expose at least an upper surface of the channel material 130 in the openings 1002. The pillar fill structure 132 and, optionally, all or part of the tunnel dielectric structure 128 may also be exposed in the openings 1002. The presence of the sacrificial liner 904 during the removal-removal acts may limit the removal of the gate oxide 140 to be just that portion along the base portion 1004. In other embodiments, the removal of the base portion 1004 of the gate oxide 140 may extend somewhat under the sacrificial liner 904. In some embodiments, upper portions of the channel material 130 may be removed, such that the channel material 130 may be somewhat recessed relative to an upper surface of the pillar fill structure 132. In other embodiments, the channel material 130 may not be recessed relative to the pillar fill structure 132. Nonetheless, the sacrificial liner 904 and the material-removal acts may be tailored to ensure at least some surface of the channel material 130 is exposed in the openings 1002 and that the charge trap structure 126 is not exposed in the openings 1002.

Figure 11:
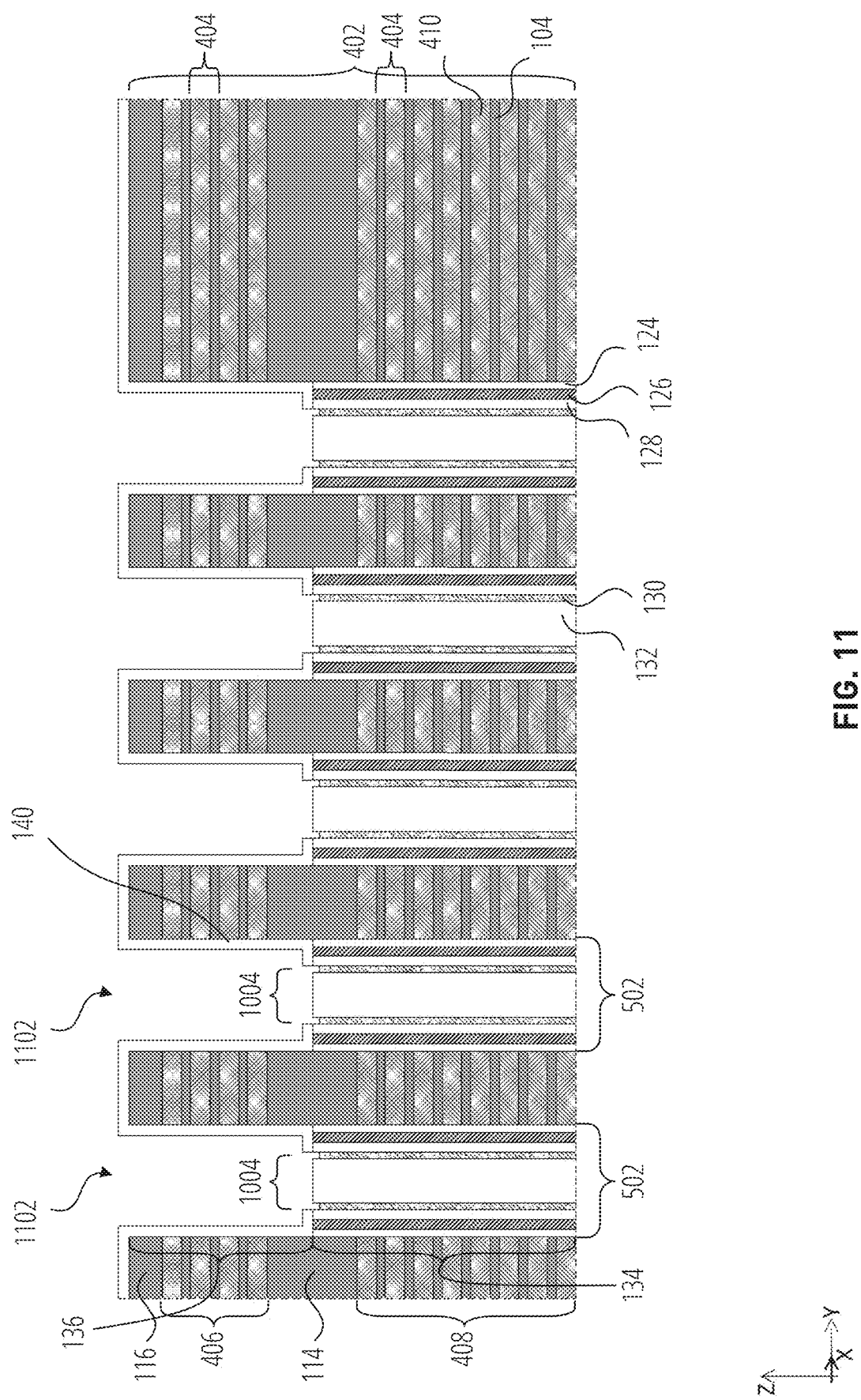

With the base portions 1004 of the gate oxide 140 removed, the sacrificial liner 904 may be removed (e.g., etched) to leave, as illustrated in FIG. 11, the gate oxide 140 along at least sidewalls of openings 1102 and with at least the channel material 130 exposed through the base portion 1004 of the gate oxide 140.

Figure 12:
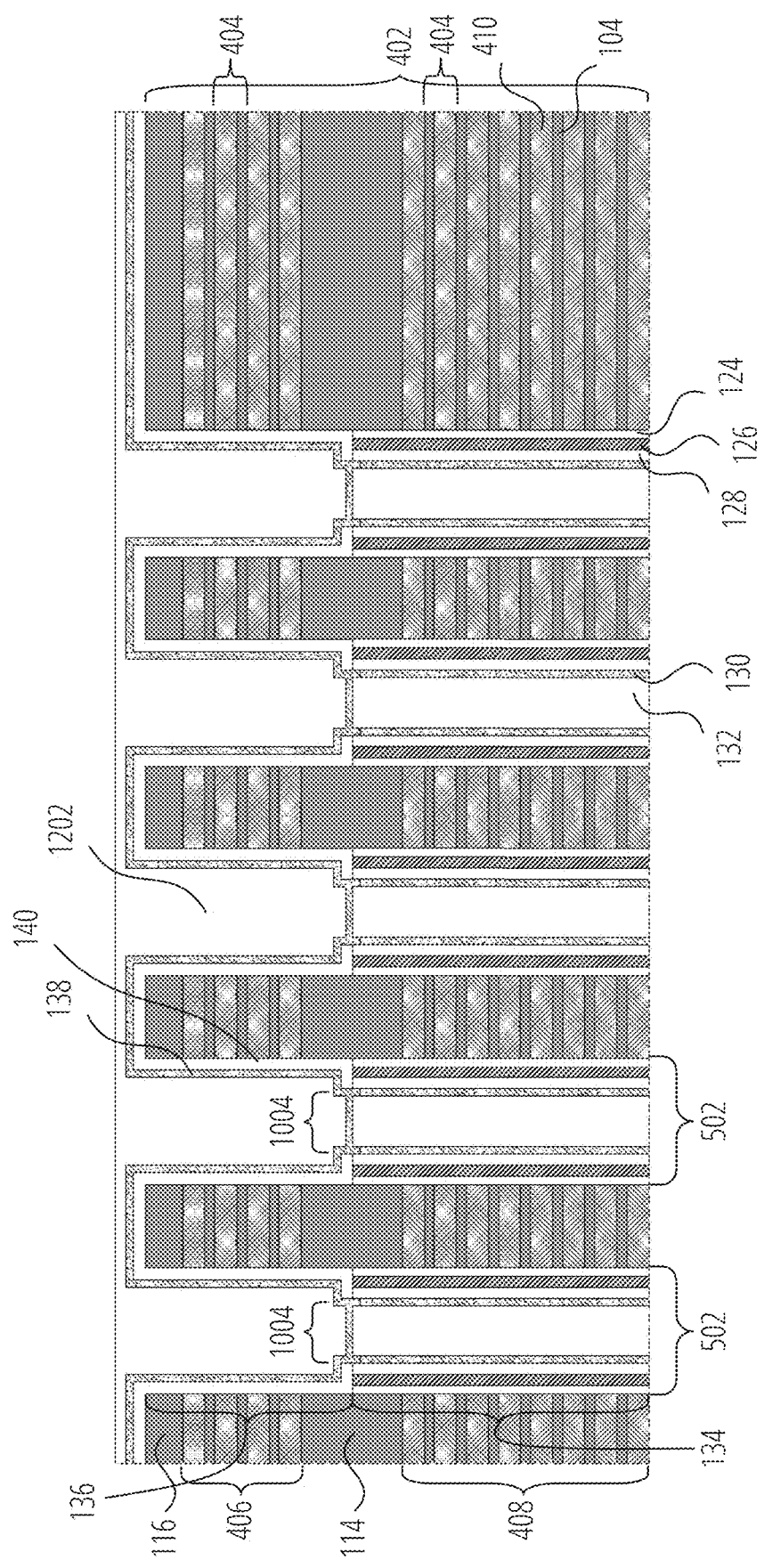

With reference to FIG. 12, the additional channel material 138 may then be formed (e.g., conformally deposited) such that the additional channel material 138 is formed in contact with that portion of the channel material 130 that was exposed along the base portion 1004. The additional channel material 138 may fully cover all exposed surfaces of the gate oxide 140 and the pillar fill structure 132, as well. In some embodiments, the additional channel material 138 is removed from, or otherwise not formed on, the pillar fill structure 132, provided that the additional channel material 138 remains in physical contact with the channel material 130. Together, the channel material 130 and the additional channel material 138 provide a channel structure (e.g., a doped hollow channel (DHC) structure) that extends through both the lower stack 408 and through the upper stack 406, as well as through the additional insulative structure 114, in the pillar areas 502.

An insulative material 1202 may be formed (e.g., deposited) on (e.g., directly on) the additional channel material 138 to fill remaining space of the openings 1102 (FIG. 11). The insulative material 1202 may be any of the materials described above with respect to the upper pillar fill structure 142.

Figure 13:
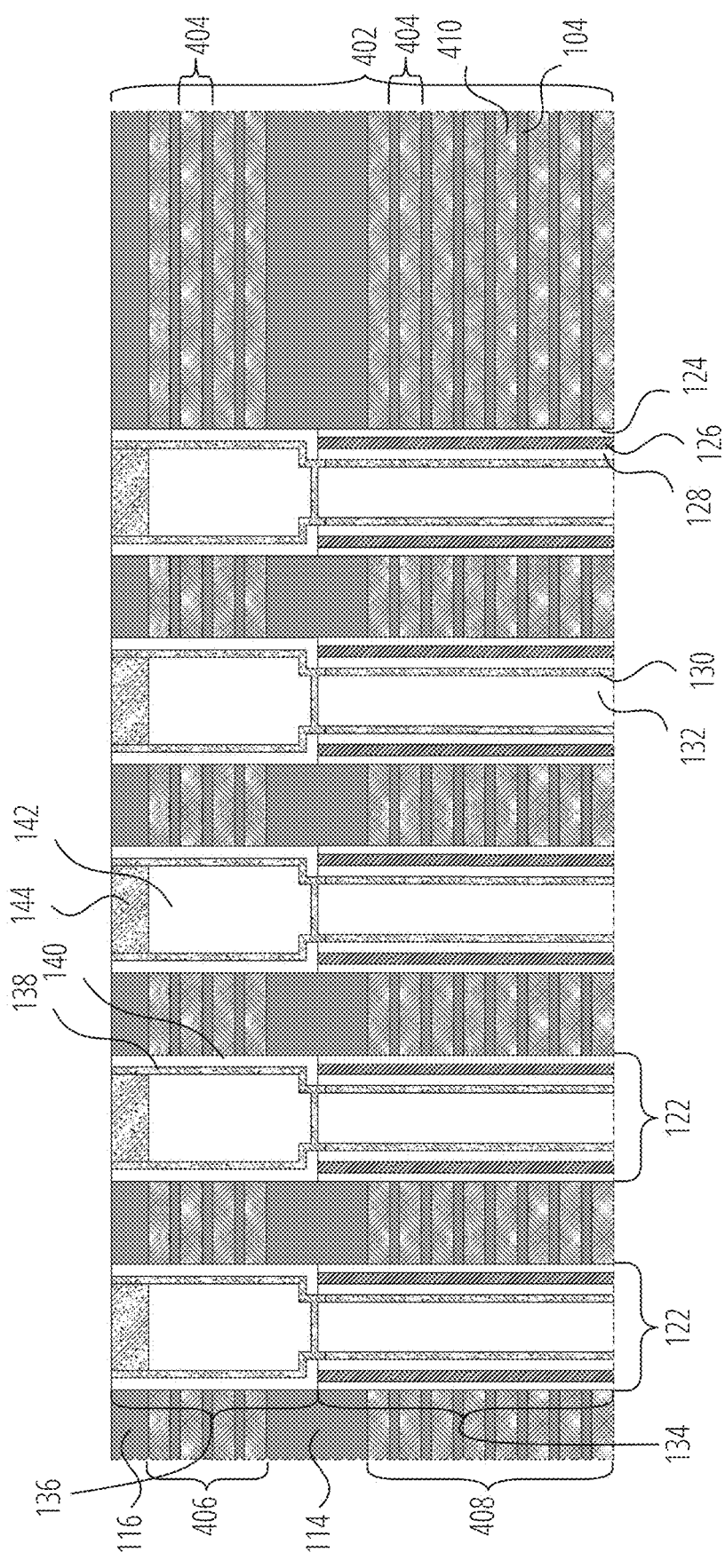

The insulative material 1202 may then be recessed, as illustrated in FIG. 13, by removing (e.g., etching) an upper portion to form the upper pillar fill structure 142 in each of the upper pillar portions 136 of the pillars 122. The plug structures 144 may then be formed in each recessed space by forming (e.g., depositing) the material of the plug structures 144 on the upper pillar fill structure 142.

Figure 14:
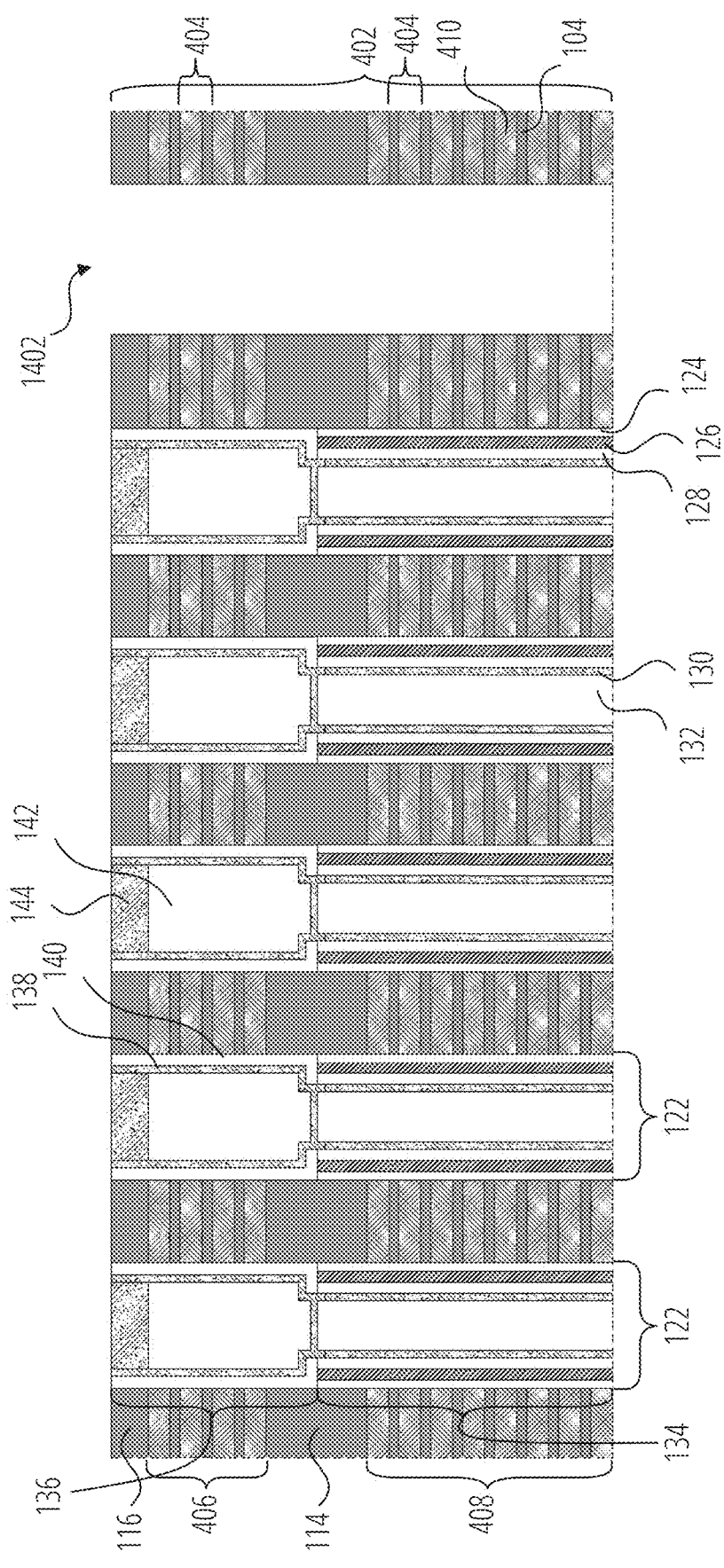

With reference to FIG. 14, slit openings 1402 may then be formed (e.g., etched) through the stack structure 402, where the slit structures 118 are to be formed, by removing select portions of the insulative structures 104 and the sacrificial structures 410, as well as select portions of the additional insulative structure 114 and the upper insulative structure 116. In embodiments in which a source structure underlies the stack structure 402, the slit openings 1402 may expose a portion of the source structure and divide the stack structure 402 into the blocks 204 (FIG. 2, FIG. 3).

The slit openings 1402 (e.g., elongate openings bordered by substantially planar sidewalls of the stack structure 402) expose the material of the sacrificial structures 410 of the tiers 404 of both the upper stack 406 and the lower stack 408. Therefore, via the slit openings 1402, at least a portion of the material of the sacrificial structures 410 may be removed as part of a so-called "replacement gate" or "gate last" process. By way of non-limiting example, the sacrificial structures 410 may be removed by exposing the sacrificial structures 410 to a wet etchant comprising one or more of phosphoric acid, sulfuric acid, hydrochloric acid, nitric acid, or another material. In some embodiments, the sacrificial structures 410 are removed by exposing the sacrificial structures 410 to a so-called "wet nitride strip" comprising a wet etching comprising phosphoric acid.

Figure 15:
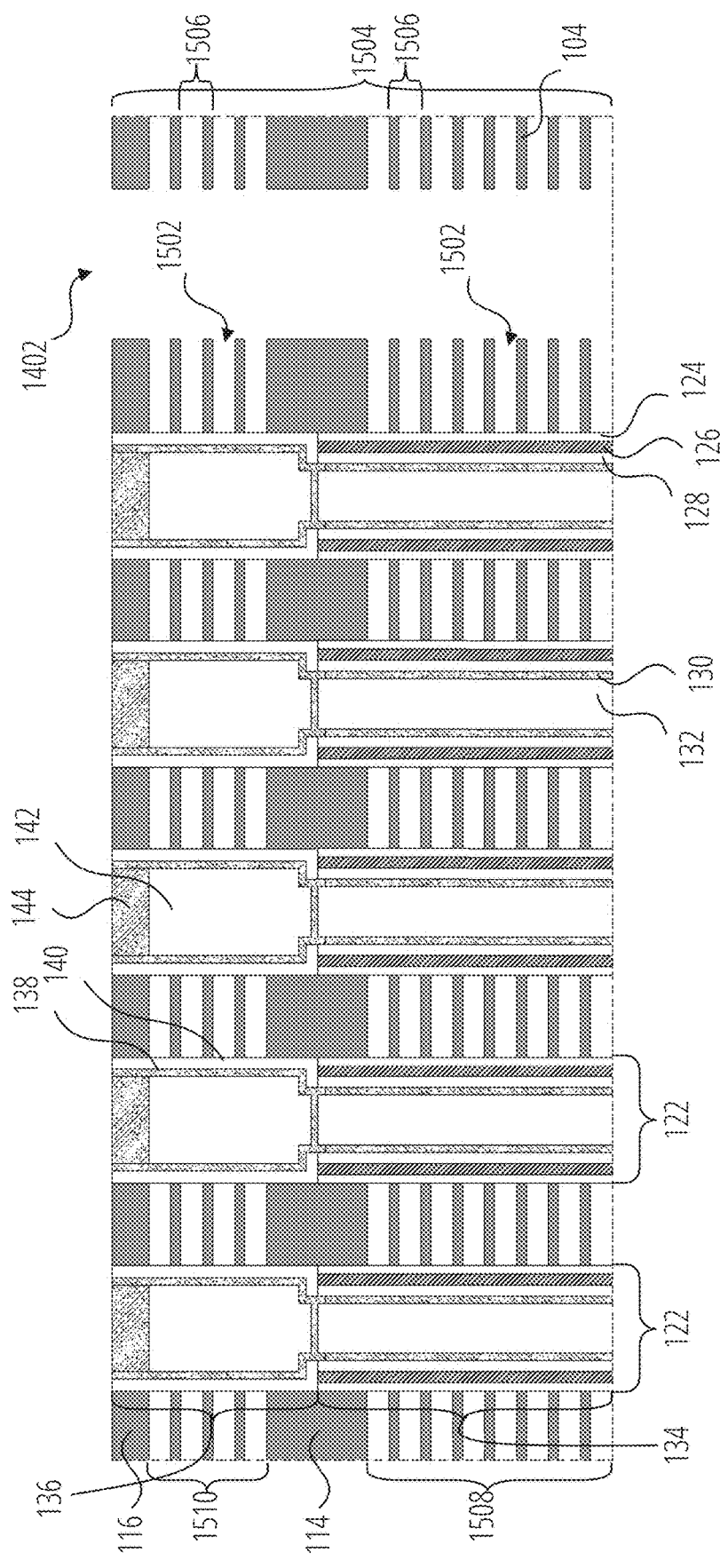

Removing the sacrificial structures 410 leaves voids 1502, as illustrated in FIG. 15, between vertically adjacent insulative structures 104, forming a stack structure 1504 with tiers 1506 of insulative structures 104 and voids 1502 in both a lower stack 1508 and an upper stack 1510.

Figure 16:
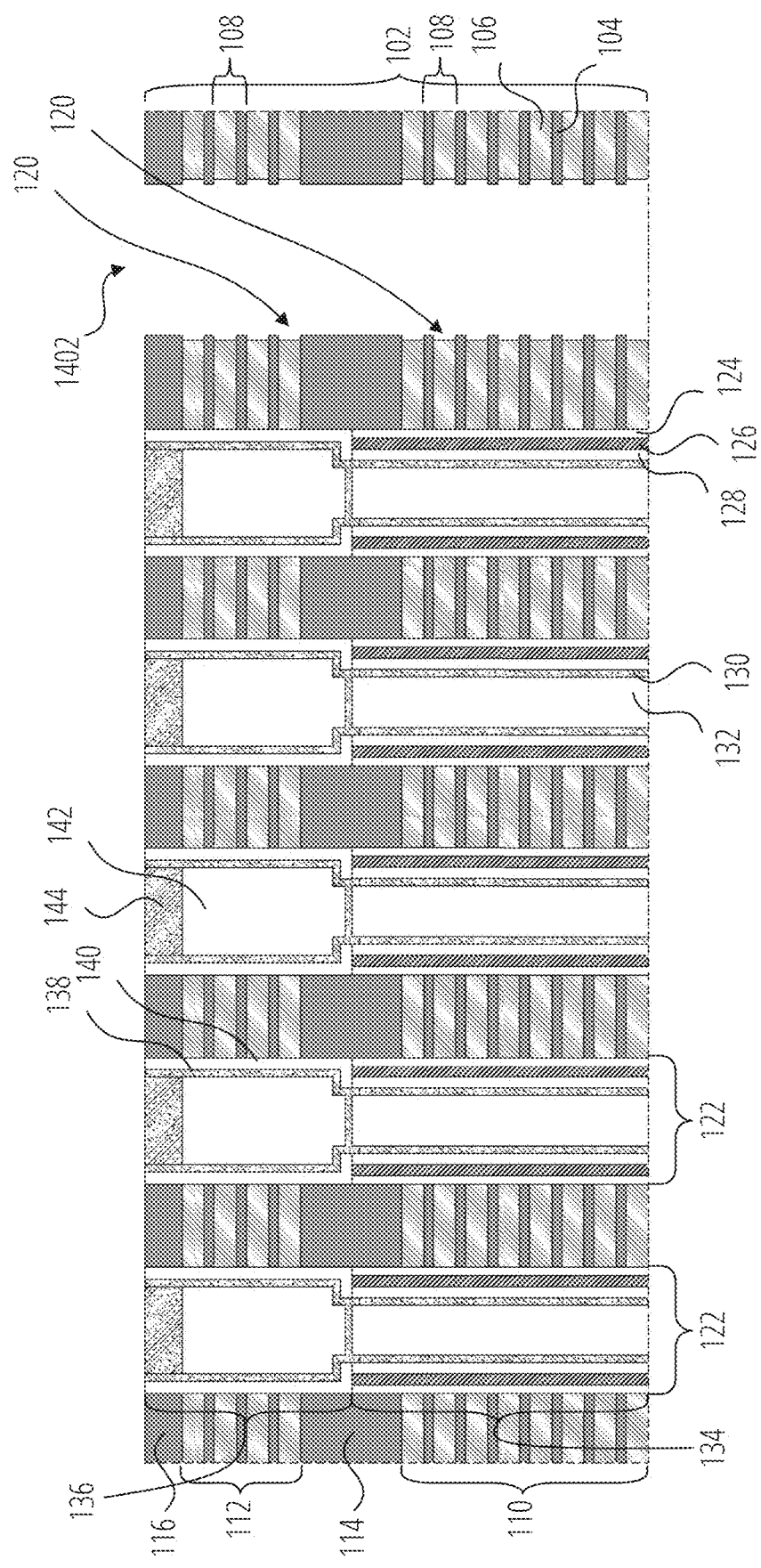

After removing the sacrificial structures 410 (FIG. 14) and forming the voids 1502, the conductive structures 106 may be formed between adjacent insulative structures 104, at the levels previously occupied by the sacrificial structures 410, as illustrated in FIG. 16. In some embodiments, forming the conductive structures 106 may include conformally forming a conductive liner (e.g., a metal nitride liner) directly on the exposed surfaces of the insulative structures 104 and the charge-blocking structure 124 and then forming (e.g., depositing, growing) another conductive material (e.g., a metal) directly on the conductive liner. The conductive liner may, therefore, be formulated to be a seed material from which the other conductive material(s) of the conductive structures 106 may be formed. The resulting stack structure 102 includes both the lower stack 110 and the upper stack 112 with tiers 108 of the insulative structures 104 and the conductive structures 106.

In some embodiments, the conductive structures 106 may be formed to leave recesses 120 at lateral ends of the conductive structures 106, adjacent the slit openings 1402. In other embodiments, the conductive structures 106 may be formed to overfill the voids 1502 (FIG. 16) and then a subsequent material-removal act may recess the conductive structures 106 to form the recesses 120. In other embodiments, the conductive structures 106 may be formed with lateral ends that substantially align with (e.g., are substantially coplanar with) lateral ends of the insulative structures 104.

Figure 17:
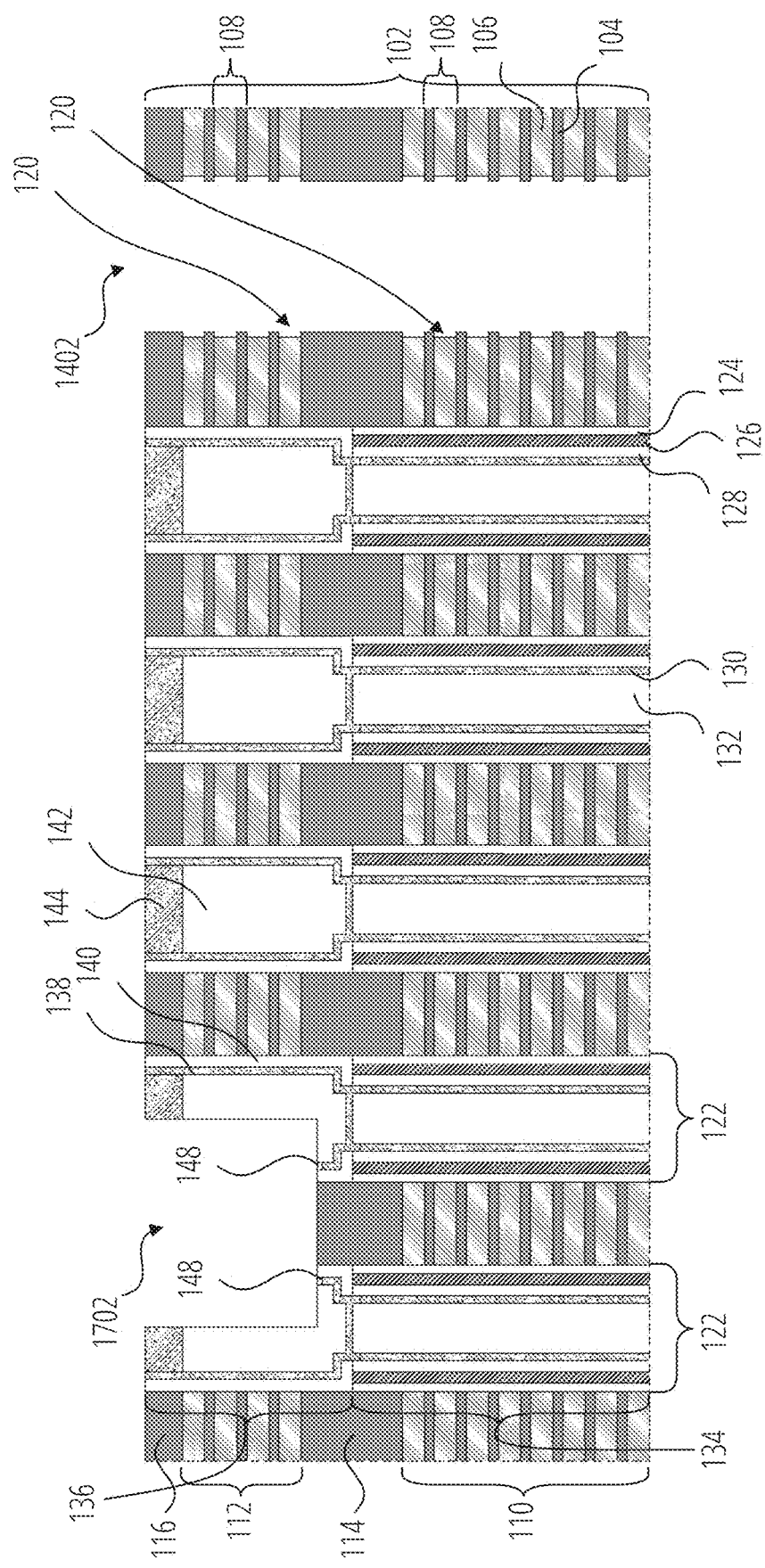

With reference to FIG. 17, upper slit openings 1702 (e.g., trenches) may be formed (e.g., etched) where the isolation structures 146 (FIG. 1) are to be formed. Thus, the upper slit openings 1702 may be formed to extend (e.g., cut) into the upper pillar portions 136 of neighboring pillars 122.

Forming the upper slit openings 1702 may expose portions of the additional channel material 138. These exposed portions may then be replaced with or converted into the channel spacers 148. For example, a selective isotropic etch may be carried out to somewhat recess the additional channel material 138 where exposed in the upper slit opening 1702, and then one or more insulative material(s) may be formed in the recesses to form the channel spacers 148. As another example, an oxidation act (e.g., a plasma-based oxidation act, a thermal oxidation act) may be performed to convert the additional channel material 138, at the exposed surfaces, into an insulative oxide material to form the channel spacers 148. In other embodiments, the additional channel material 138 may not be recessed or otherwise converted into the channel spacers 148 where exposed in the upper slit openings 1702.

In some embodiments, a liner (e.g., a nitride liner) may be formed on all surfaces exposed within the upper slit openings 1702, such as on the channel spacers 148 (if present), the upper pillar fill structure 142 surfaces, and the plug structure 144 sidewalls exposed in the upper slit openings 1702.

With or without forming the liner, the material(s) of the isolation structures 146 (FIG. 1) may then be formed in the upper slit openings 1702, the material(s) of the slit structures 118 (FIG. 1) may be formed in the slit openings 1402, and the whole structure may be subjected to planarization, to complete the isolation structures 146 and the slit structures 118, such as those illustrated in FIG. 1, FIG. 2, and FIG. 3.

The dielectric structure 152 (FIG. 1) may be formed (e.g., deposited) on the stack structure 102 and may then be patterned to form openings in which the conductive contacts 150 may then be formed to complete the microelectronic device structure 100 of FIG. 1.

Notably, the methods of the disclosure may enable forming the openings for both the lower stack 110 and the upper stack 112 of the pillars 122 in a single etching act, or in multiple etching acts carried out in sequence, such that a longitudinal axis of the upper stack 112 and the lower stack 110 of each pillar 122 is aligned. The fabrication method may, therefore, be simpler than conventional methods that involve separate patterning for a lower stack as for an upper stack of a pillar.

Accordingly, disclosed is a method of forming a microelectronic device. The method comprises forming a stack structure comprising a vertically alternating sequence of insulative structures and conductive structures arranged in tiers. A series of pillars, extending through the stack structure, is also formed. At least one slit structure is formed adjacent the series of pillars. The at least one slit structure also extends through the stack structure. At least one isolation structure is formed to extend through an upper stack portion of the stack structure. The at least one isolation structure protrudes into pillars of neighboring columns of pillars of the series of pillars. Conductive contacts are formed in electrical communication with the pillars into which the at least one isolation structure protrudes.

While the fabrication method illustrated in FIG. 4 through FIG. 17 includes formation of the slit openings 1402 for the slit structures 118 and performance of the replacement gate process prior to formation of the upper slit openings 1702 for the isolation structures 146, in other embodiments, the upper slit openings 1702 may be formed before forming the slit openings 1402.

Figure 18:
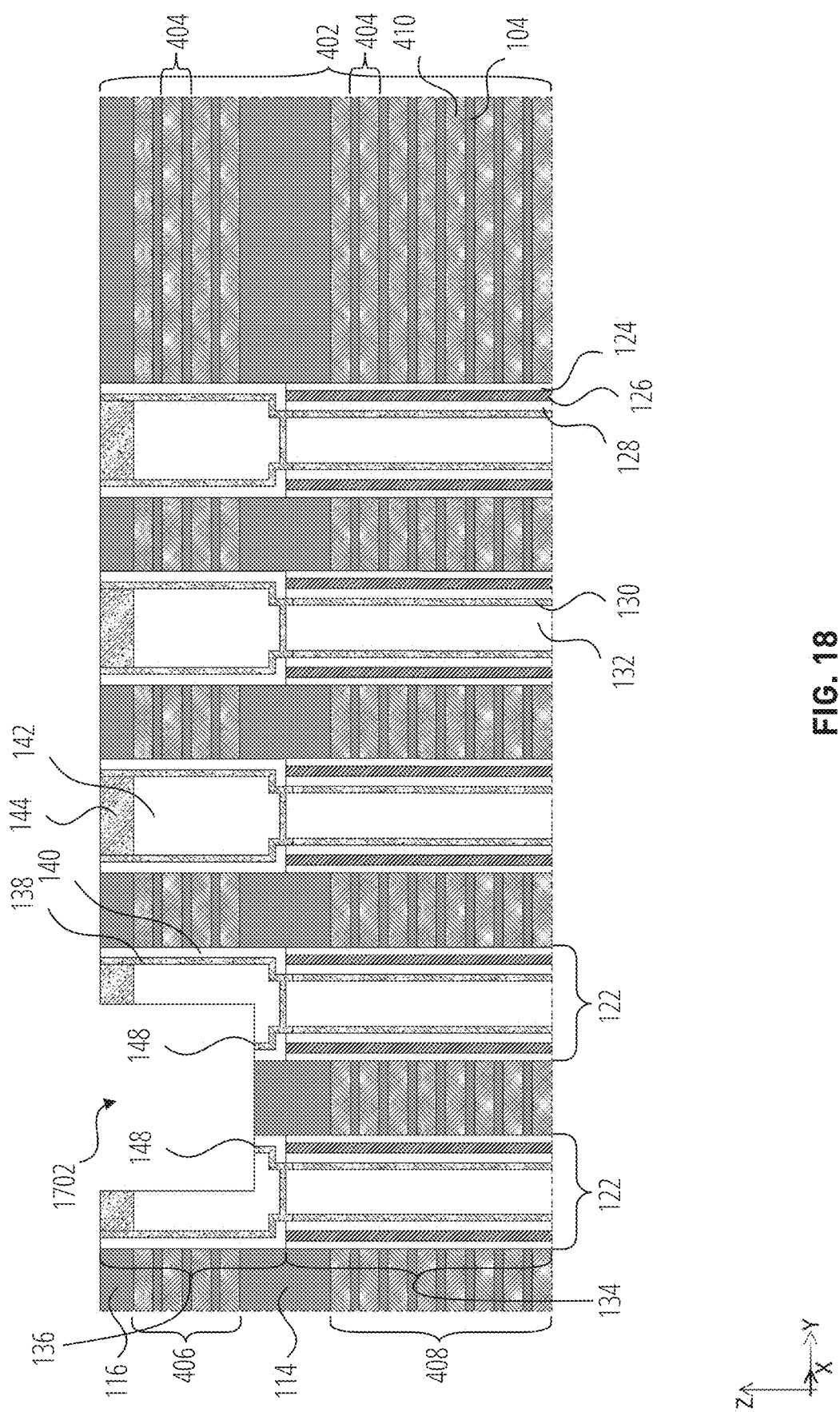
FIG. 18 and FIG. 19, in conjunction with FIG. 4 through FIG. 13, are cross-sectional, elevational, schematic illustrations during various stages of processing to fabricate a microelectronic device structure, such as the microelectronic device structures of any of FIG. 1 through FIG. 3, in accordance with embodiments of the disclosure, wherein the stage of FIG. 18 may follow that of FIG. 13.

For example, with reference to FIG. 18, illustrated is a stage in a fabrication method that may follow that of FIG. 4 through FIG. 13, discussed above. After forming the pillars 122 according to the desired arrangement for the pillar array, the upper slit openings 1702 may be formed (e.g., etched)

into those pillars 122 that are to accommodate the isolation structures 146 (FIG. 1). Accordingly, forming the upper slit openings 1702 may include etching through the tiers 404 of the upper stack 406 with the insulative structures 104 and the sacrificial structures 410, rather than through tiers 108 that already include conductive structures 106 (FIG. 17).

Figure 19:
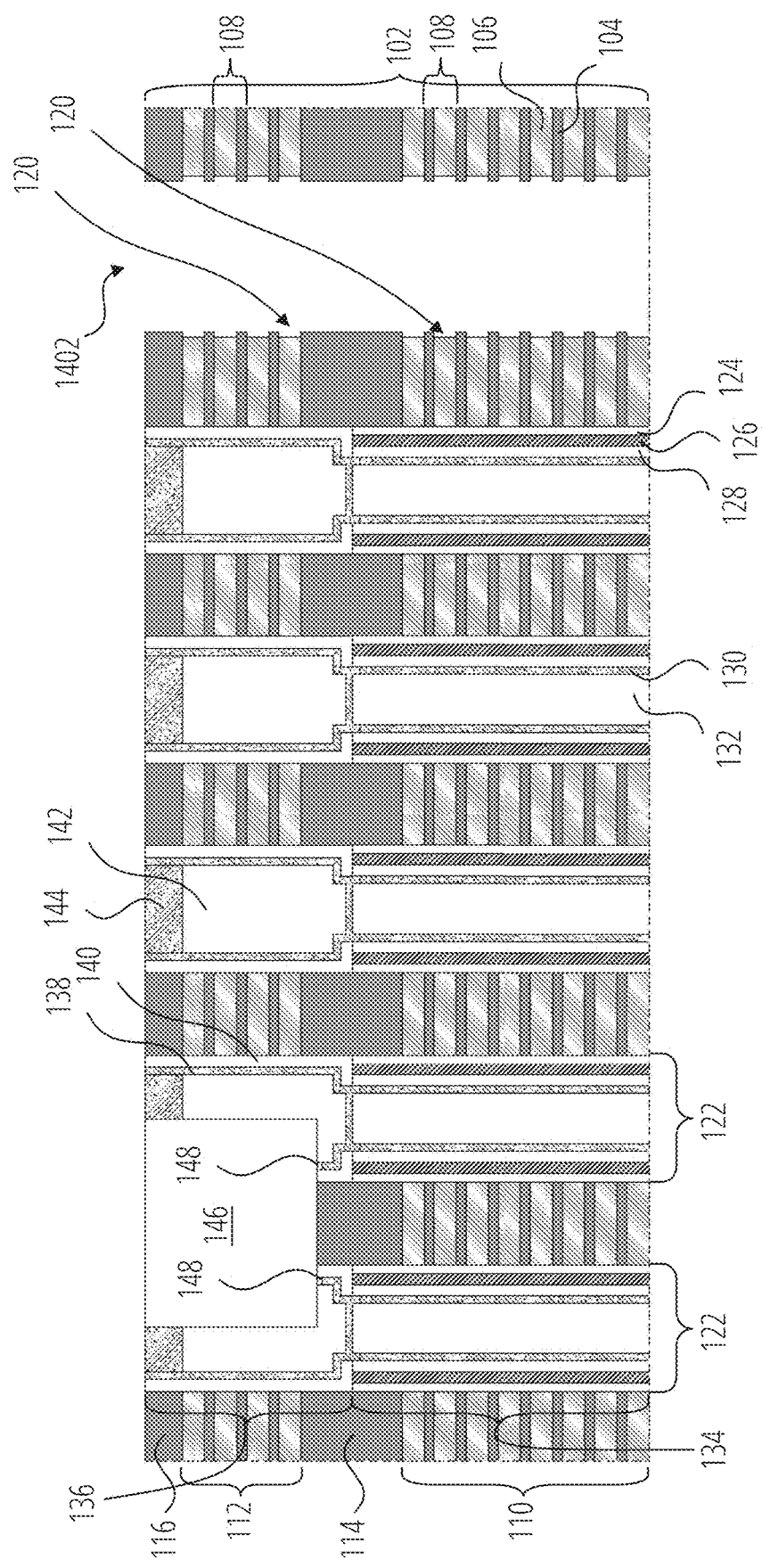

Before or after forming the channel spacers 148 and filling the upper slit openings 1702 to form the isolation structures 146, the slit openings 1402 may be formed and the replacement gate process conducted to replace the sacrificial structures 410 with the conductive structures 106, as illustrated in FIG. 19. The slit openings 1402 may then be filled, as described above, to form the slit structures 118 of the microelectronic device structure 100 of FIG. 1, the microelectronic device structure 200 of FIG. 2, or the microelectronic device structure 300 of FIG. 3.

While the fabrication methods so-far illustrated and described with regard to FIG. 4 through FIG. 19 included removing the charge-blocking structure 124 (FIG. 8) in the upper pillar portions 136 and forming, afresh, the gate oxide 140 therein, in other embodiments, the charge-blocking structure 124 may not be removed and replaced. For example, with reference to FIG. 20, the charge-blocking structure 124 may be left to extend continuously along the sidewall of the pillars 122, from the lower pillar portion 134, along the additional insulative structure 114, and through the upper stack 112 and the upper insulative structures 116. The additional channel material 138 may then be formed (e.g., conformally deposited) directly on the charge-blocking structure 124 and exposed surfaces of the pillar fill structure 132, the channel material 130, the tunnel dielectric structure 128, and the charge trap structure 126. The upper pillar fill structure 142 and the plug structure 144 may then be formed, as described above. Likewise, the slit structures 118 may be formed, and the replacement gate process conducted to form the conductive structures 106, as described above, either before or after forming the isolation structures 146.

Accordingly, formed is a microelectronic device structure 2000 with the pillars 122 that include the charge-blocking structure 124 continuously along sidewalls of the pillars 122. Like the pillars 122 of the microelectronic device structure 100 of FIG. 1, the microelectronic device structure 200 of FIG. 2, and the microelectronic device structure 300 of FIG. 3, the additional channel material 138 directly contacts the channel material 130 to provide a DHC structure extending through the pillars 122.

Figure 20:
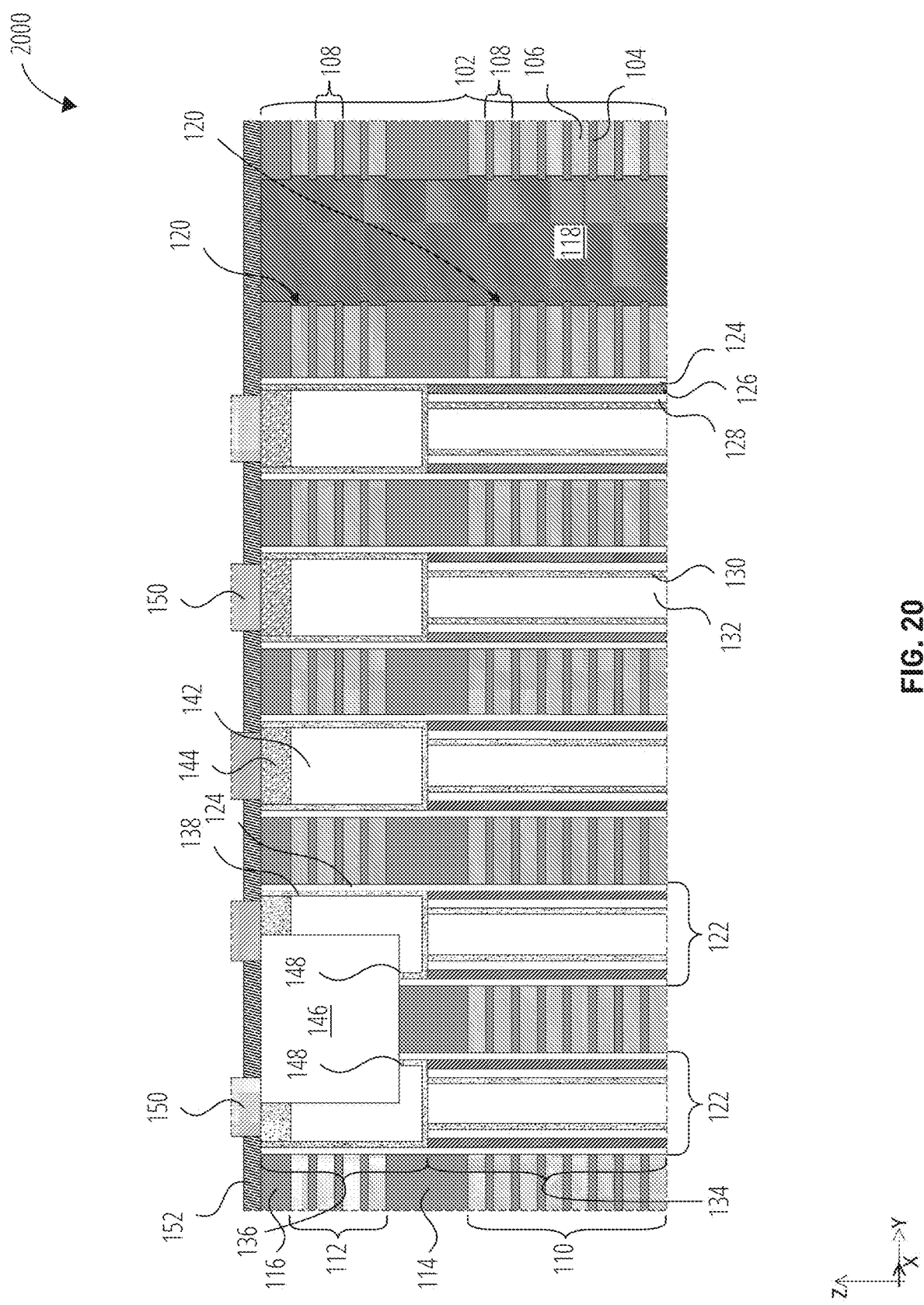
FIG. 20, in conjunction with FIG. 4 through FIG. 6, are cross-sectional, elevational, schematic illustrations during various stages of processing to fabricate a microelectronic device structure, illustrated in FIG. 20, in accordance with embodiments of the disclosure, wherein the stage of FIG. 20 may follow that of FIG. 6.
Figure 21:
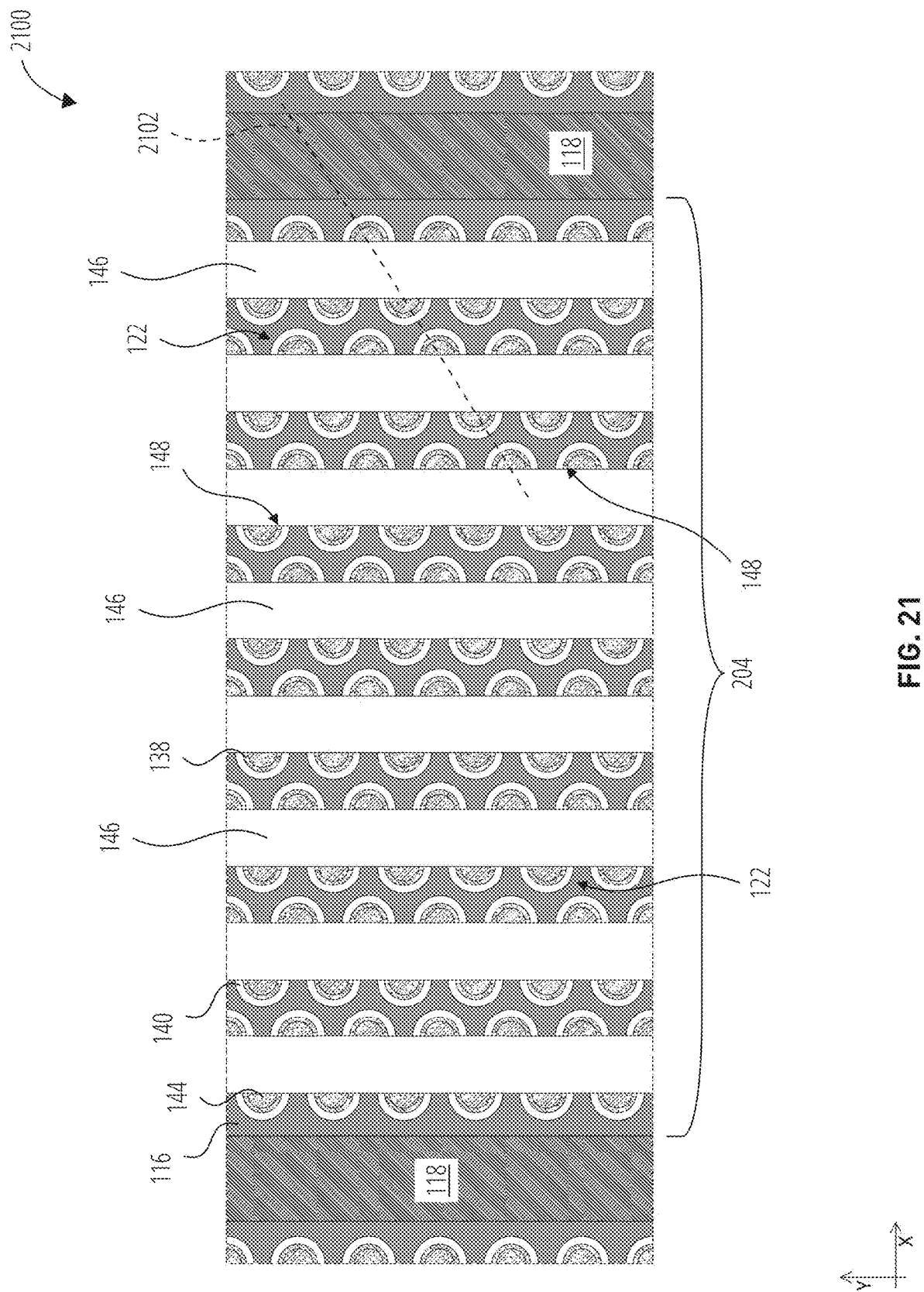
FIG. 21 is a top plan, schematic illustration of a microelectronic device structure, in accordance with embodiments of the disclosure—without showing conductive contacts and a dielectric structure, for ease of illustration—wherein isolation trenches are formed through an upper portion of each neighboring pair of pillars across a block.

FIG. 21 illustrates, from a top plan view, a microelectronic device structure 2100 with a greater number of isolation structures 146 per the block 204, than the embodiments described above. The view of FIG. 20 may correspond to a view along section line 2102.

For example, one isolation structure 146 may be formed to cut into each neighboring pair of pillars 122. Therefore, each pillar 122 of the block 204 (e.g., laterally between the slit structures 118, at least in the "active" areas of the pillar array) includes an upper pillar portion 136 (FIG. 1) that is partially-circular in horizontal cross-sectional area. By forming each of the pillars 122 to have a substantially same partial-circular cross-section in the upper pillar portion 136, the pillars 122 may each exhibit substantially the same performance during operation.

The shape of the isolation structures 146 of the microelectronic device structure 2100 with all partially-cut pillars 122 may be substantially straight, as illustrated in FIG. 21, or may be formed to exhibit a different shape, such as the wave shape from FIG. 3, or a mix of shapes that permit the isolation structures 146 to pass between and partially into the pillars 122 of neighboring columns in the pillar array.

In some embodiments, the microelectronic device structure 2100 of FIG. 21—with one isolation structure 146 for each pair of columns of the pillars 122 in the pillar array of the block 204—may be formed by any of the above-described methods with the greater number of isolation structures 146 formed, per number of pillars 122. In other embodiments, the method of fabrication may be different.

Figure 22:
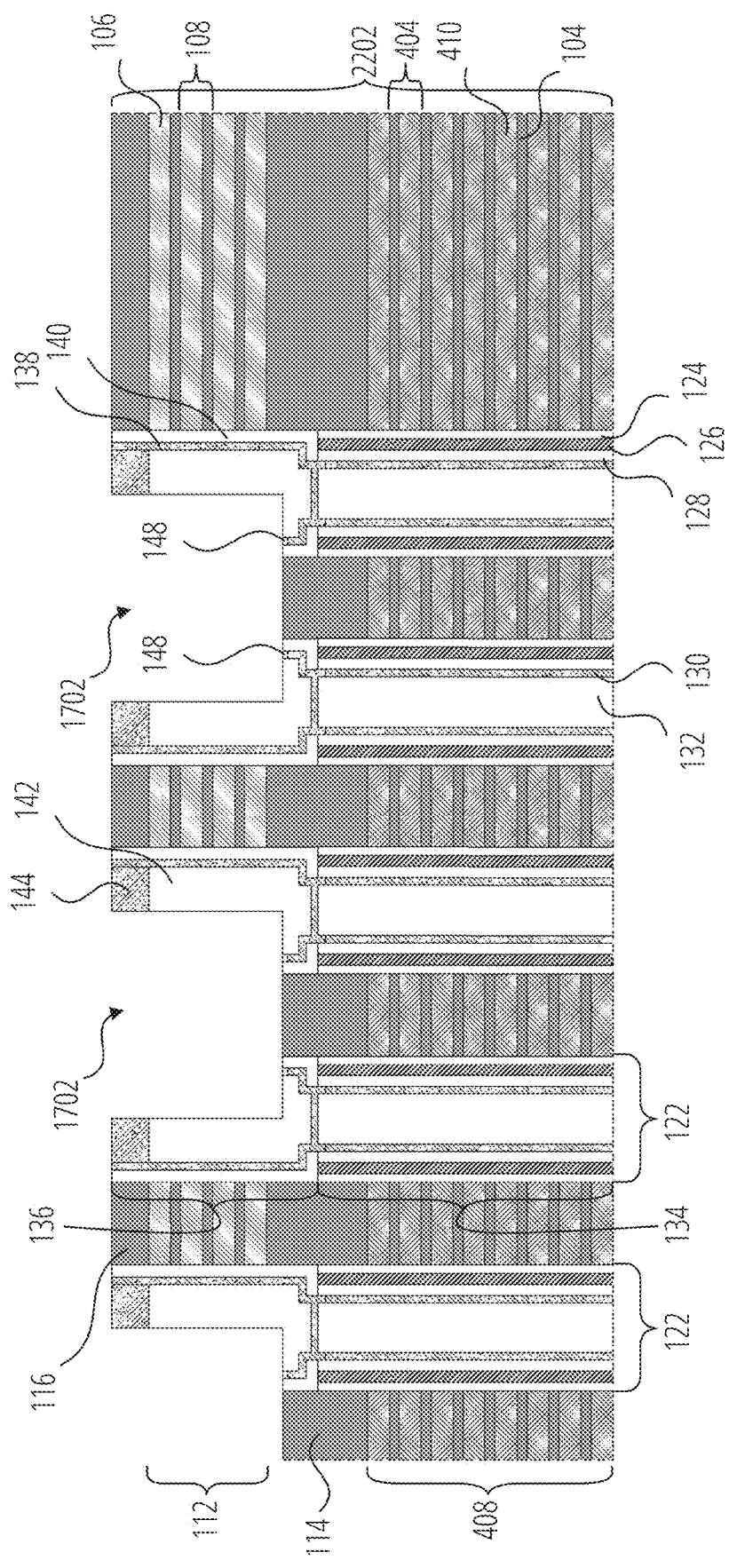
FIG. 22 through FIG. 24, in conjunction with FIG. 4 through FIG. 13, are cross-sectional, elevational, schematic illustrations during various stages of processing to fabricate a microelectronic device structure, illustrated in FIG. 24, in accordance with embodiments of the disclosure, wherein the stage of FIG. 22 may follow that of FIG. 13, and the device structure of FIG. 24 may include the microelectronic device structure of FIG. 21 such that the structure of FIG. 24 may be a view along section line 2102 of FIG. 21.
Figure 23:
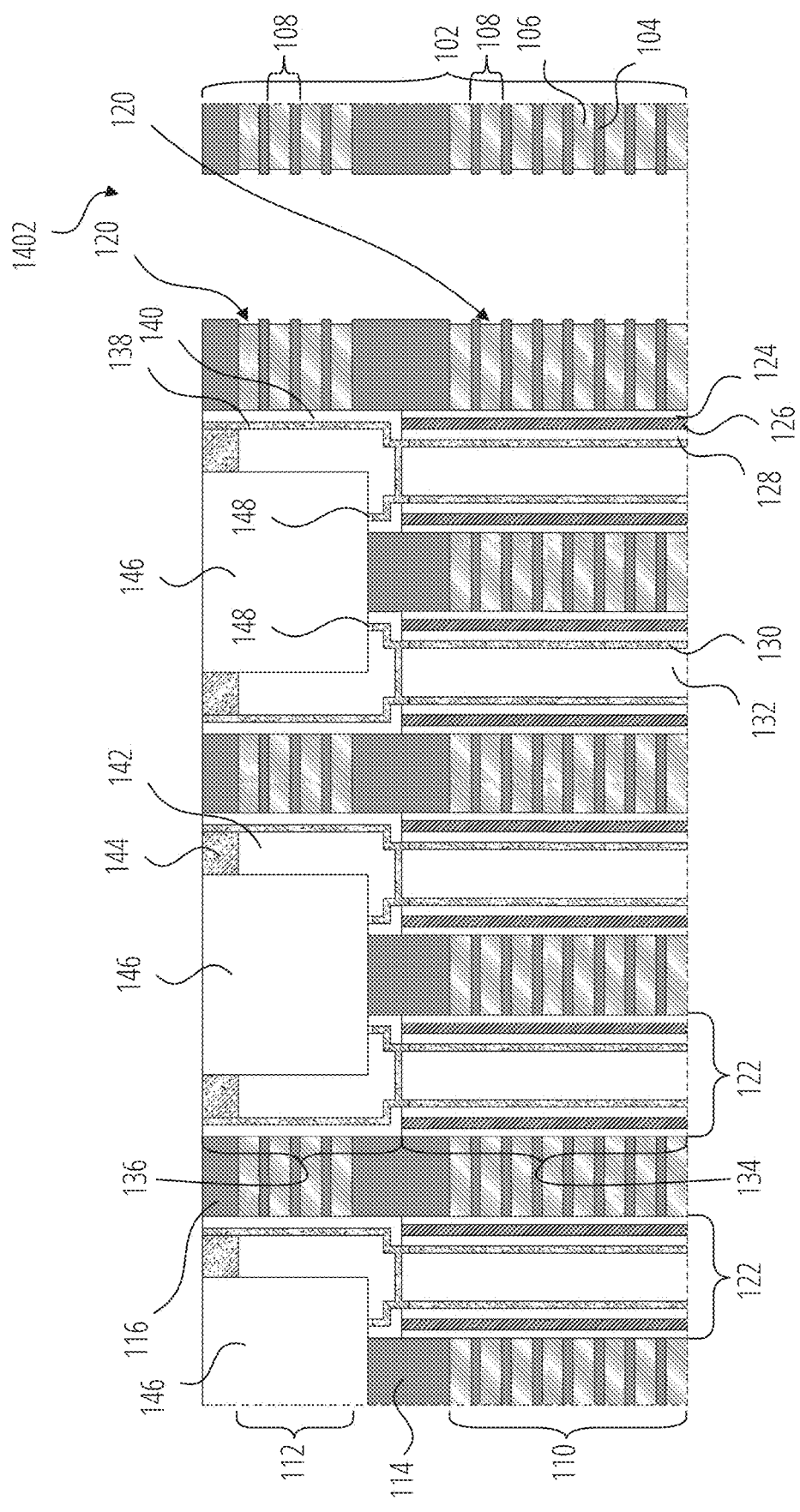
Figure 24:
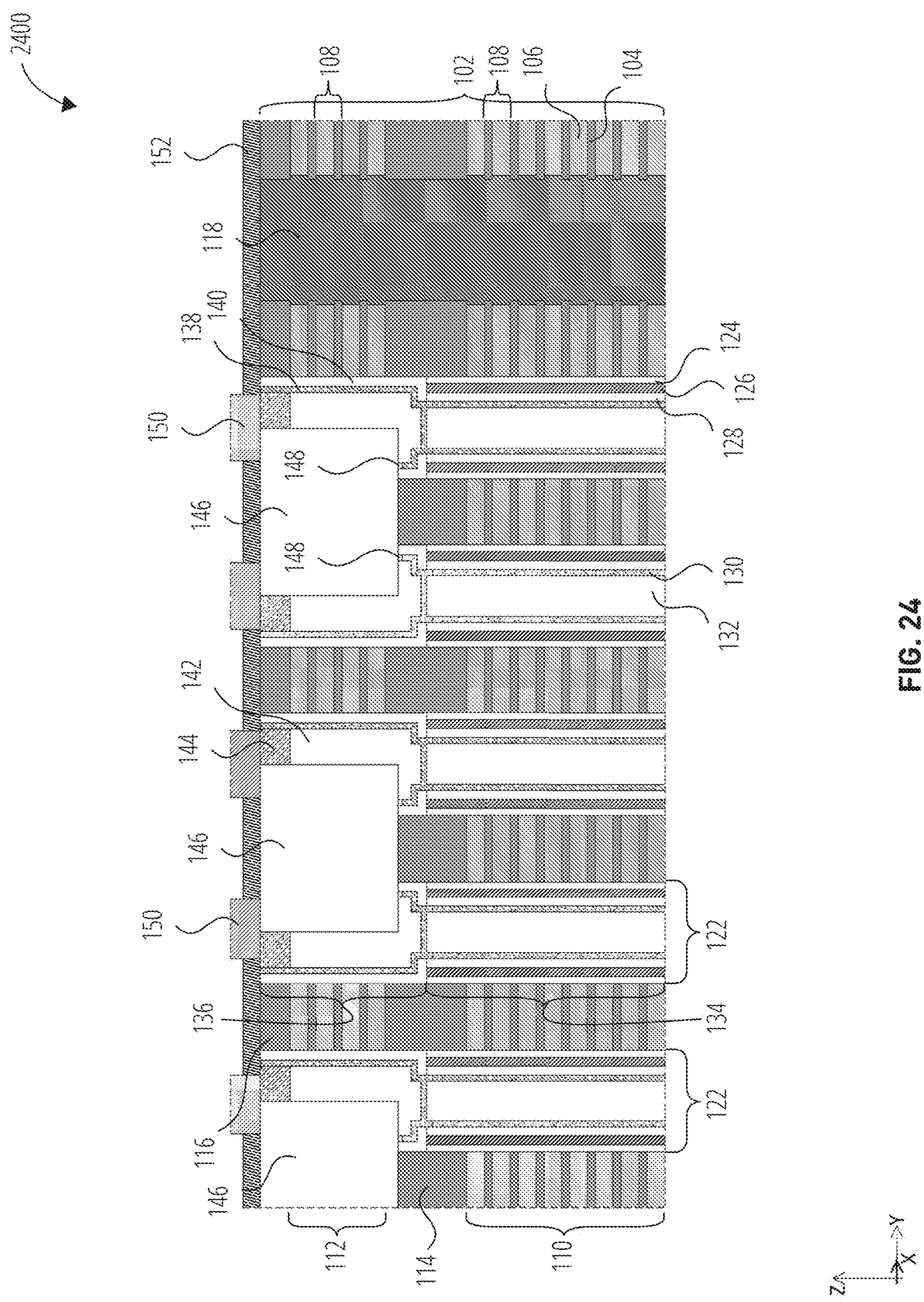

For example, FIG. 22 through FIG. 24 illustrate various stages of processing, according to another embodiment, to fabricate a microelectronic device structure with one isolation structure 146 per every neighboring pair of columns of the pillars 122. The stage of FIG. 22 may follow that of FIG. 13, such that FIG. 4 through FIG. 13 may illustrate various stages of processing, prior to that of FIG. 22 through FIG. 24. The upper slit opening 1702—for each of the isolation structures 146 (FIG. 21) to be formed—may be formed (e.g., etched) prior to forming the slit openings 1402 for the slit structures 118. For example, the upper slit openings 1702 may be formed through the upper stack 406 (FIG. 13) with the tiers 404 that include the sacrificial structures 410. With the upper slit openings 1702 formed, the sacrificial structures 410 of the upper stack 406 may be exposed in the upper slit openings 1702. Then, the replacement gate process may be performed to replace the sacrificial structures 410 of the upper stack 406 with the conductive structures 106, to form the tiers 108 of the upper stack 112, as illustrated in FIG. 22. Accordingly, a stack structure 2202 is formed in which the lower stack 408 includes the tiers 404 with the sacrificial structures 410 and in which the upper stack 112 includes the tiers 108 with the conductive structures 106.

The channel spacers 148 may be formed before or after the replacement gate process.

As illustrated in FIG. 23, the slit openings 1402 may then be formed, such as by etching first through the upper stack 112 with the tiers 108 having the conductive structures 106 and then by continuing to etch through the lower stack 408 (FIG. 22) with the tiers 404 having the sacrificial structures 410. Forming the slit openings 1402 may be carried out in one or more material-removal acts.

Before or after forming the slit openings 1402 the material(s) of the isolation structures 146 may be formed.

With the slit openings 1402 formed, the sacrificial structures 410 of the lower stack 408 of the stack structure 2202 (FIG. 22) may be substantially removed (e.g., exhumed) and replaced with the conductive structures 106, according to the aforementioned replacement gate process, forming the structure of FIG. 23.

The material(s) of the slit structures 118 may then be formed in the slit openings 1402, as illustrated in FIG. 24. Also, the dielectric structure 152 and the conductive contacts 150 may be formed over the stack structure 102, to form a microelectronic device structure 2400 with substantially the same materials and structures as that microelectronic device structure 2100 of FIG. 21, in which case the view of FIG. 24 may be that along section line 2102 of FIG. 21. Moreover, the microelectronic device structure 2400 may include substantially the same materials and structures of any of the microelectronic device structures 100 of FIG. 1, the microelectronic device structure 200 of FIG. 2, and/or the microelectronic device structure 300 of FIG. 3, but with a greater number of the isolation structures 146 formed and with all of the pillars 122 having partial-circle (e.g., about semi-circle or greater-than-semi-circle) horizontal cross-sectional areas for their upper pillar portions 136.

In some embodiments, the pillars 122 of FIG. 22 through FIG. 24 may have been formed with the structure of those of FIG. 20, such that the charge-blocking structure 124 may extend fully along the sidewall of the pillars 122. Accordingly, the microelectronic device structure 2000 of FIG. 20 may be otherwise configured and formed, in accordance with the descriptions of FIG. 22 through FIG. 24, to include one isolation structure 146 for every neighboring pair of columns of pillars 122.

The pillars 122 of the aforementioned embodiments may be configured as "non-programmable" pillars. In other embodiments, the pillars 122 may be configured as "programmable."

Figure 25:
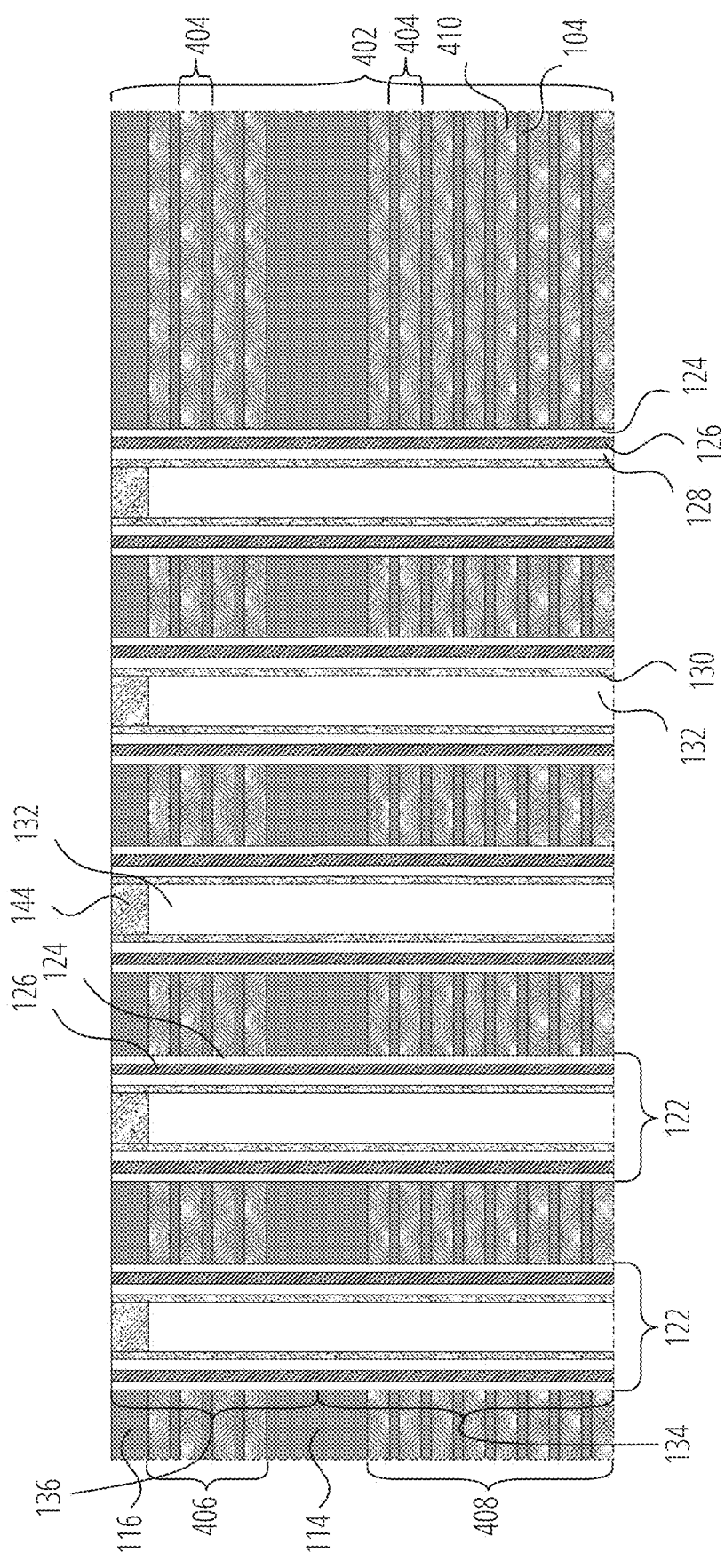
FIG. 25 and FIG. 26, in conjunction with FIG. 4 and FIG. 5, are cross-sectional, elevational, schematic illustrations during various stages of processing to fabricate a microelectronic device structure, illustrated in FIG. 26, in accordance with embodiments of the disclosure, wherein the stage of FIG. 25 may follow that of FIG. 5.

For example, with reference to FIG. 25, programmable pillars (e.g., pillars 122 of FIG. 25) may be formed, in openings formed through the stack structure 402, with substantially the same materials in the lower pillar portion 134 continuing through the additional insulative structure 114 and the upper stack 406. Accordingly, the charge-blocking structure 124, the charge trap structure 126, the tunnel dielectric structure 128, the channel material 130, and the pillar fill structure 132 each extend through the lower pillar portion 134, the additional insulative structure 114, and the upper stack 406. The plug structures 144 may be formed within the channel material 130. The channel material 130 may, alone, provide a DHC structure.

Figure 26:
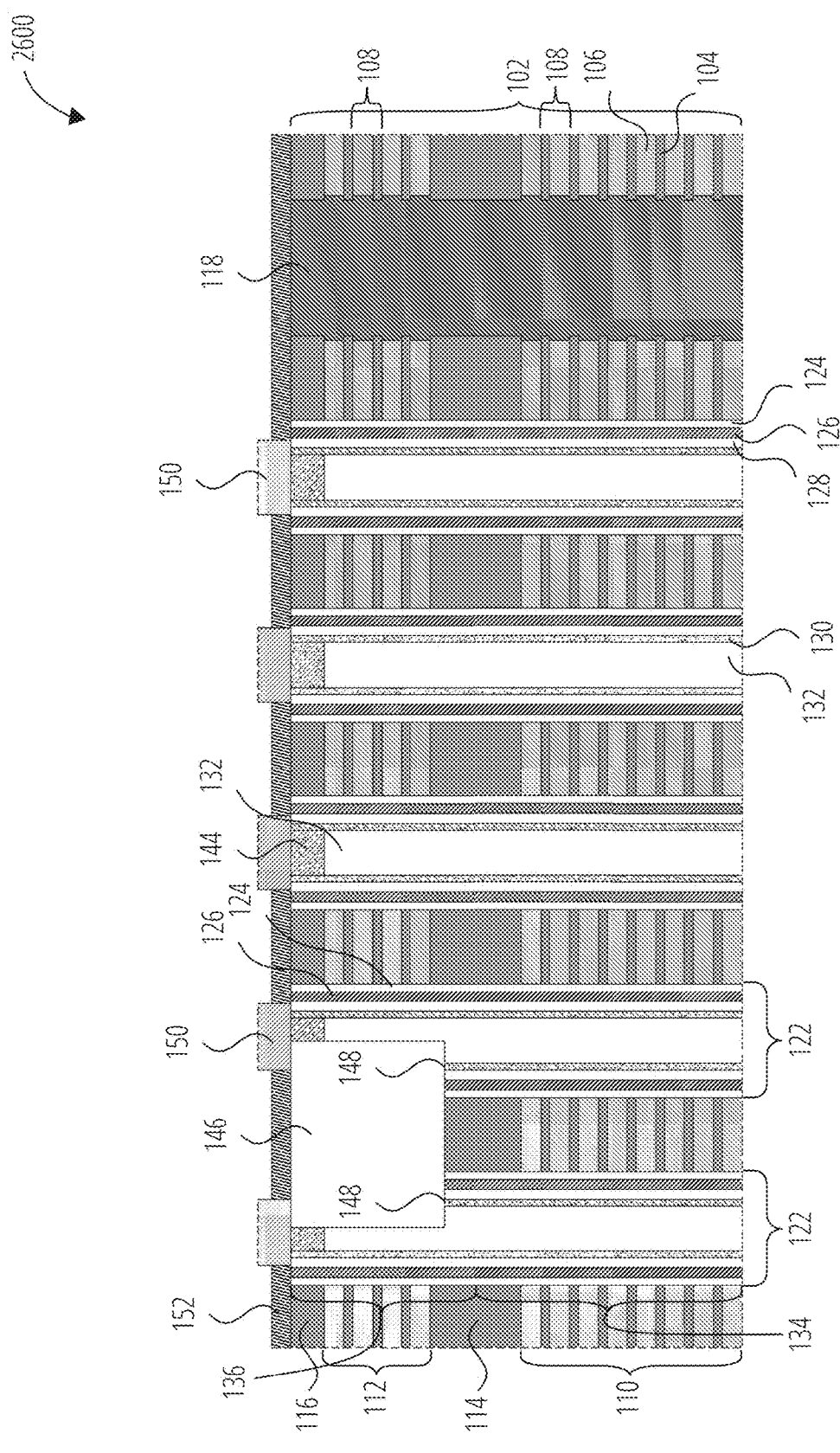

With reference to FIG. 26, the isolation structures 146, the slit structures 118, and the conductive structures 106 may be formed in any of the manners described above, and with any number of and/or shape of the isolation structures 146, as described above, with the exception that the isolation structures 146 cut into the pillar fill structure 132, the tunnel dielectric structure 128, the charge trap structure 126, and the charge-blocking structure 124 and the channel spacers 148 may be formed along edges of the channel material 130. The dielectric structure 152 and the conductive contacts 150 may be formed over the stack structure 102 to form a microelectronic device structure 2600 with at least one isolation structure 146 formed to cut partially into the upper pillar portions 136 of the pillars 122 of neighboring columns of the pillars 122.

Figure 27:
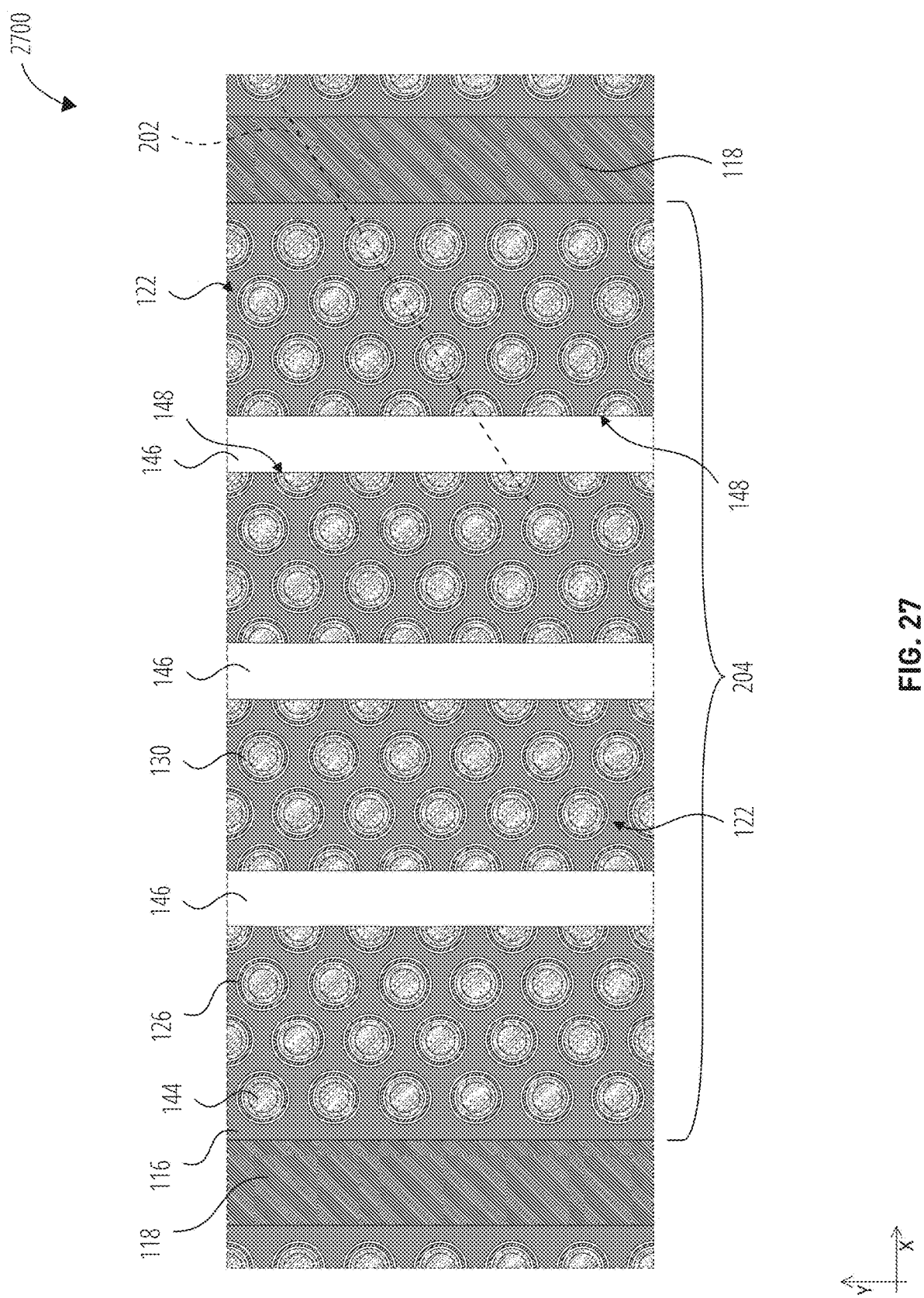
FIG. 27 is a top plan, schematic illustration of a microelectronic device structure, in accordance with embodiments of the disclosure—without showing conductive contacts and a dielectric structure, for ease of illustration—wherein the microelectronic device structure of FIG. 26 may be a view along section line 202 of FIG. 27, and isolation trenches are formed as substantially-straight parallel structures.

FIG. 27 illustrates a microelectronic device structure 2700 that may include the microelectronic device structure 2600 of FIG. 26, without the dielectric structure 152 and the conductive contacts 150 illustrated for ease of view. The microelectronic device structure 2600 of FIG. 26 may correspond to a view along section line 202 of FIG. 27. Accordingly, an upper surface of the upper insulative structure 116 may be coplanar with upper ends of the charge-blocking structure 124 (FIG. 26), the charge trap structure 126, the tunnel dielectric structure 128 (FIG. 26), and the channel material 130.

Notably, the microelectronic device structures formed in accordance with embodiments of the disclosure—e.g., the microelectronic device structure 100 of FIG. 1, the microelectronic device structure 200 of FIG. 2, the microelectronic device structure 300 of FIG. 3, the microelectronic device structure 2000 of FIG. 20, the microelectronic device structure 2100 of FIG. 21, the microelectronic device structure 2400 of FIG. 24, the microelectronic device structure 2600 of FIG. 26, and/or the microelectronic device structure 2700 of FIG. 27—may eliminate the need for "dummy" pillars as the pillar structures that are at least partially cut into by the isolation structures 146, leaving valuable footprint area to be occupied by additional "active" pillars and/or to be eliminated from the block 204 so as to reduce block 204 size without sacrificing device performance.

Accordingly, disclosed is a microelectronic device comprising a stack structure and pillars. The stack structure comprises vertically interleaved insulative structures and conductive structures. The pillars are arranged in columns and extend through the stack structure. The pillars are in electrical communication with conductive contacts adjacent the stack structure. Each of the pillars comprises a lower pillar portion and an upper pillar portion with at least one coplanar sidewall. The lower pillar portion extends through a lower stack portion of the stack structure. The upper pillar portion extends through an upper stack portion of the stack structure. At least one isolation structure passes between and at least partially into the upper pillar portions of the pillars of at least one neighboring pair of the columns.

Figure 28:
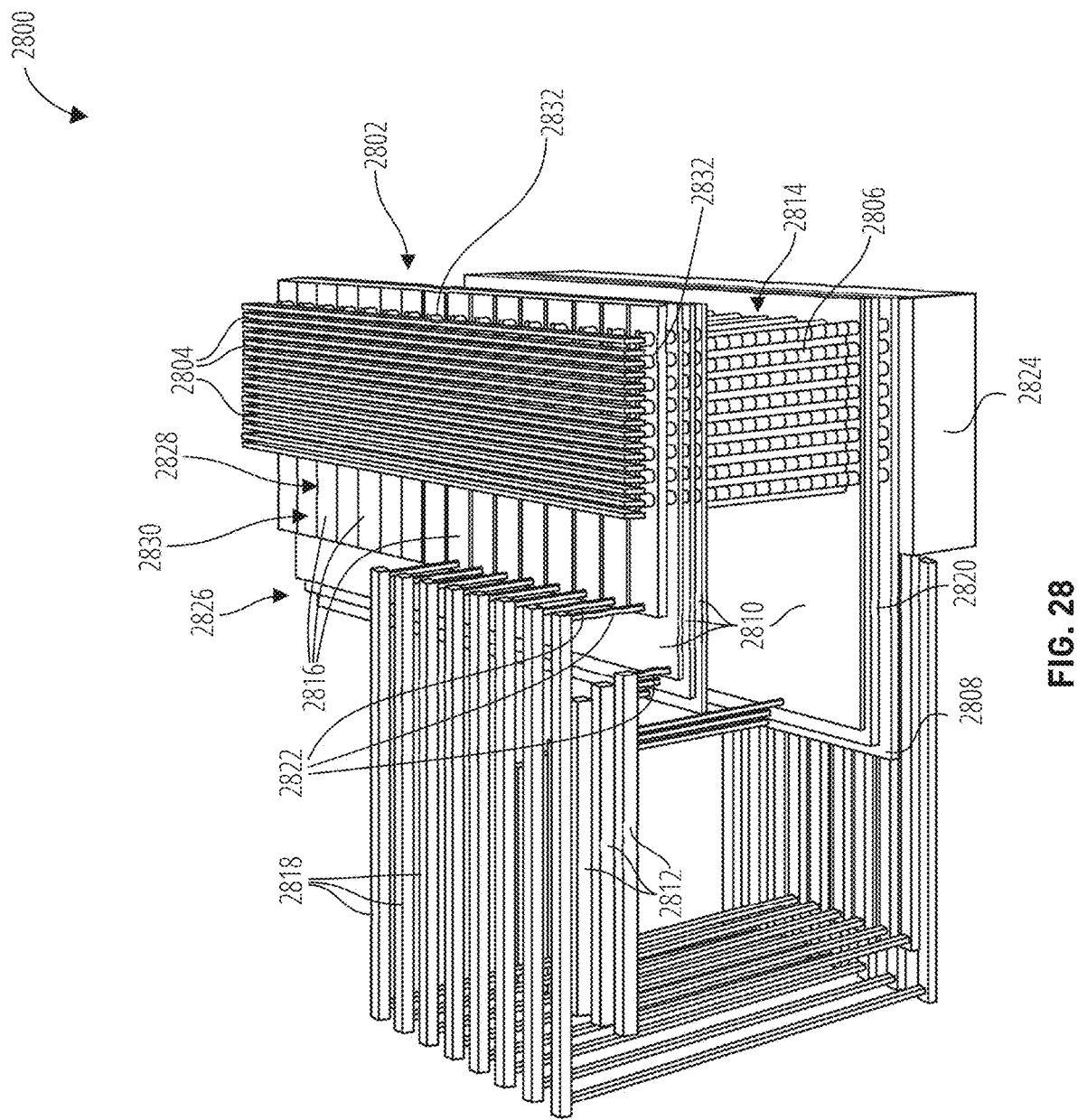
FIG. 28 is a partial, cutaway, perspective, schematic illustration of a microelectronic device, in accordance with embodiments of the disclosure.

With reference to FIG. 28, illustrated is a partial cutaway, perspective, schematic illustration of a portion of a microelectronic device 2800 (e.g., a memory device, such as a dual deck 3D NAND Flash memory device) including a microelectronic device structure 2802. The microelectronic device structure 2802 may be substantially similar to any one or more of the microelectronic device structures described above (e.g., the microelectronic device structure 100 of FIG. 1, the microelectronic device structure 200 of FIG. 2, the microelectronic device structure 300 of FIG. 3, the microelectronic device structure 2000 of FIG. 20, the microelectronic device structure 2100 of FIG. 21, the microelectronic device structure 2400 of FIG. 24, the microelectronic device structure 2600 of FIG. 26, and/or the microelectronic device structure 2700 of FIG. 27), and may have been formed by any of the methods described above.

As illustrated in FIG. 28, the microelectronic device structure 2802 may include a staircase structure 2826 defining contact regions for connecting access lines 2812 to conductive tiers 2810 (e.g., conductive layers, conductive plates, such as the conductive structures 106 (e.g., FIG. 1) of the stack structures 102 (e.g., FIG. 1)). The microelectronic device structure 2802 may include pillars 122 (e.g., FIG. 1) with strings 2814 (e.g., strings of memory cells) that are coupled to each other in series. The pillars 122 with the strings 2814 may extend at least somewhat vertically (e.g., in the Z-direction) and orthogonally relative to conductive tiers 2810, relative to data lines 2804, relative to a source tier 2808 (e.g., within one or more base structures(s) under the stack structure 102 (e.g., FIG. 1)), relative to access lines 2812, relative to first select gates 2816 (e.g., upper select gates, drain select gates (SGDs) (e.g., the conductive structures 106 of the upper stack 112 (e.g., FIG. 1))), relative to select lines 2818, and/or relative to a second select gate 2820 (e.g., a lower select gate, a source select gate (SGS)). The first select gates 2816 may be horizontally divided (e.g., in the X-direction) into multiple blocks 2830 (e.g., blocks 204 (e.g., FIG. 2)) by slits 2828 (e.g., slit structures 118 (e.g., FIG. 1)).

Vertical conductive contacts 2822 may electrically couple components to each other, as illustrated. For example, the select lines 2818 may be electrically coupled to the first select gates 2816, and the access lines 2812 may be electrically coupled to the conductive tiers 2810. The microelectronic device 2800 may also include a control unit 2824 positioned under the memory array, which may include at least one of string driver circuitry, pass gates, circuitry for selecting gates, circuitry for selecting conductive lines (e.g., the data lines 2804, the access lines 2812), circuitry for amplifying signals, and circuitry for sensing signals. The control unit 2824 may be electrically coupled to the data lines 2804, the source tier 2808, the access lines 2812, the first select gates 2816, and/or the second select gates 2820, for example. In some embodiments, the control unit 2824 includes CMOS (complementary metal-oxide-semiconductor) circuitry. In such embodiments, the control unit 2824 may be characterized as having a "CMOS under Array" ("CuA") configuration.

The first select gates 2816 may extend horizontally in a first direction (e.g., the Y-direction) and may be coupled to respective first groups of strings 2814 of memory cells 2806 at a first end (e.g., an upper end) of the strings 2814. The second select gate 2820 may be formed in a substantially planar configuration and may be coupled to the strings 2814 at a second, opposite end (e.g., a lower end) of the strings 2814 of memory cells 2806.

The data lines 2804 (e.g., bit lines) may extend horizontally in a second direction (e.g., in the X-direction) that is at an angle (e.g., perpendicular) to the first direction in which the first select gates 2816 extend. The data lines 2804 may be coupled to respective second groups of the strings 2814 at the first end (e.g., the upper end) of the strings 2814. A first group of strings 2814 coupled to a respective first select gate 2816 may share a particular string 2814 with a second group of strings 2814 coupled to a respective data line 2804. Thus, a particular string 2814 may be selected at an intersection of a particular first select gate 2816 and a particular data line 2804. Accordingly, the first select gates 2816 may be used for selecting memory cells 2806 of the strings 2814 of memory cells 2806.

The conductive tiers 2810 (e.g., word line plates, conductive structures 106 (e.g., FIG. 1)) may extend in respective horizontal planes. The conductive tiers 2810 may be stacked vertically, such that each conductive tier 2810 is coupled to all of the strings 2814 of memory cells 2806, and the strings 2814 of the memory cells 2806 extend vertically through the stack (e.g., stack structure 102 (e.g., FIG. 1)) of conductive tiers 2810. The conductive tiers 2810 may be coupled to or may form control gates of the memory cells 2806 to which the conductive tiers 2810 are coupled. Each conductive tier 2810 may be coupled to one memory cell 2806 of a particular string 2814 of memory cells 2806.

The first select gates 2816 and the second select gates 2820 may operate to select a particular string 2814 of the memory cells 2806 between a particular data line 2804 and the source tier 2808. Thus, a particular memory cell 2806 may be selected and electrically coupled to a data line 2804 by operation of (e.g., by selecting) the appropriate first select gate 2816, second select gate 2820, and conductive tier 2810 that are coupled to the particular memory cell 2806.

The staircase structure 2826 may be configured to provide electrical connection between the access lines 2812 and the conductive tiers 2810 through the vertical conductive contacts 2822. In other words, a particular level of the conductive tiers 2810 may be selected via one of the access lines 2812 that is in electrical communication with a respective one of the conductive contacts 2822 in electrical communication with the particular conductive tier 2810.

The data lines 2804 may be electrically coupled to the strings 2814 through conductive structures 2832.

Microelectronic devices (e.g., the microelectronic device 2800) including microelectronic device structures (e.g., the microelectronic device structure 100 of FIG. 1, the microelectronic device structure 200 of FIG. 2, the microelectronic device structure 300 of FIG. 3, the microelectronic device structure 2000 of FIG. 20, the microelectronic device structure 2100 of FIG. 21, the microelectronic device structure 2400 of FIG. 24, the microelectronic device structure 2600 of FIG. 26, and/or the microelectronic device structure 2700 of FIG. 27) may be used in embodiments of electronic systems of the disclosure.

Figure 29:
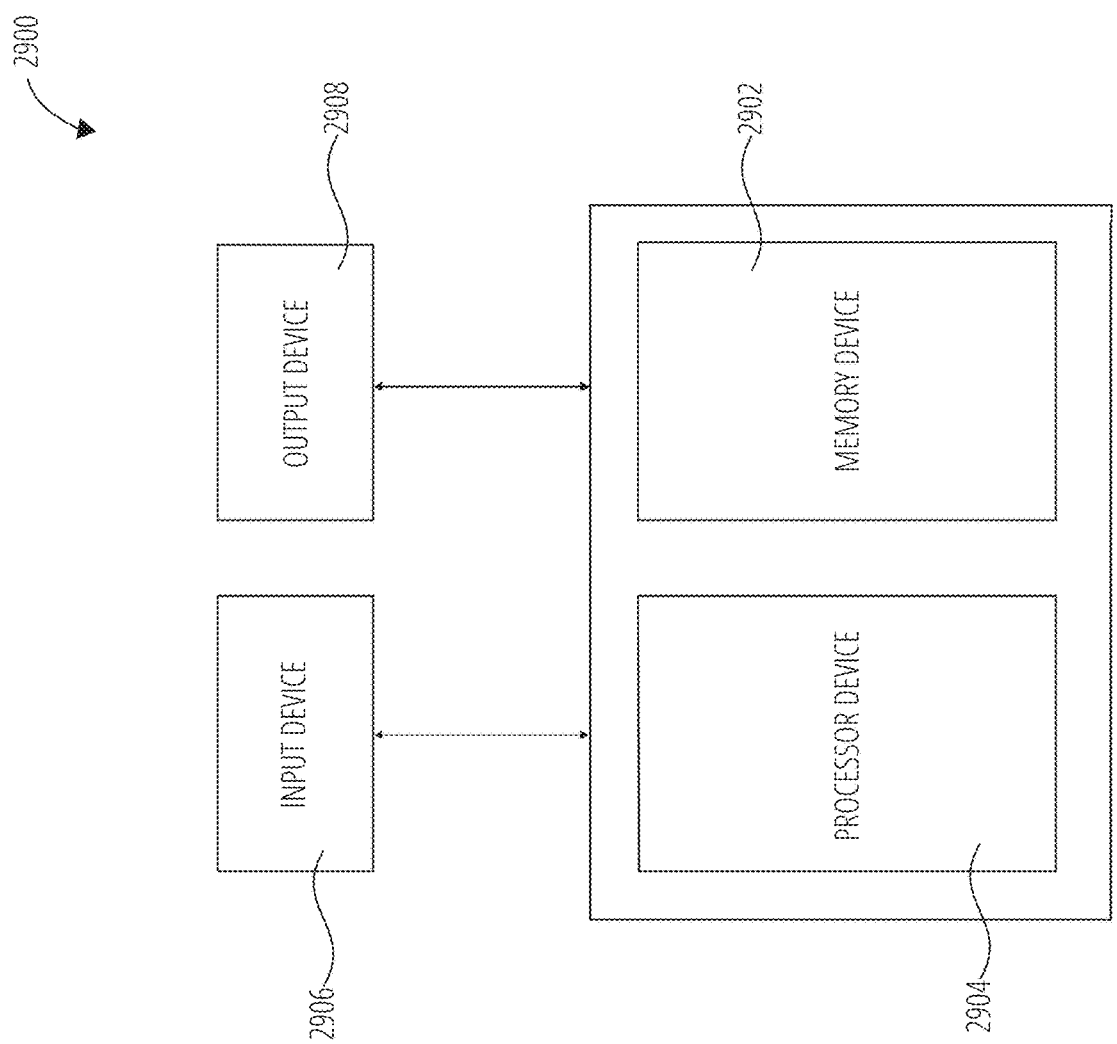
FIG. 29 is a block diagram of an electronic system, in accordance with embodiments of the disclosure.

For example, FIG. 29 is a block diagram of an electronic system 2900, in accordance with embodiments of the disclosure. The electronic system 2900 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 2900 includes at least one memory device 2902. The memory device 2902 may include, for example, one or more embodiment of a microelectronic device and/or structure previously described herein (e.g., the microelectronic device structure 100 of FIG. 1, the microelectronic device structure 200 of FIG. 2, the microelectronic device structure 300 of FIG. 3, the microelectronic device structure 2000 of FIG. 20, the microelectronic device structure 2100 of FIG. 21, the microelectronic device structure 2400 of FIG. 24, the microelectronic device structure 2600 of FIG. 26, and/or the microelectronic device structure 2700 of FIG. 27), e.g., with structures formed according to embodiments previously described herein.

The electronic system 2900 may further include at least one electronic signal processor device 2904 (often referred to as a "microprocessor"). The processor device 2904 may, optionally, include an embodiment of a microelectronic device and/or a microelectronic device structure previously described herein (e.g., the microelectronic device 2800 of FIG. 28, the microelectronic device structure 100 of FIG. 1, the microelectronic device structure 200 of FIG. 2, the microelectronic device structure 300 of FIG. 3, the microelectronic device structure 2000 of FIG. 20, the microelectronic device structure 2100 of FIG. 21, the microelectronic device structure 2400 of FIG. 24, the microelectronic device structure 2600 of FIG. 26, and/or the microelectronic device structure 2700 of FIG. 27).

The electronic system 2900 may further include one or more input devices 2906 for inputting information into the electronic system 2900 by a user, such as, for example, a mouse or other pointing device, a keyboard, a touchpad, a button, or a control panel. The electronic system 2900 may further include one or more output devices 2908 for outputting information (e.g., visual or audio output) to a user such as, for example, a monitor, a display, a printer, an audio output jack, a speaker, etc. In some embodiments, the input device 2906 and the output device 2908 may comprise a single touchscreen device that can be used both to input information into the electronic system 2900 and to output visual information to a user. The input device 2906 and the output device 2908 may communicate electrically with one or more of the memory device 2902 and the electronic signal processor device 2904.

Accordingly, disclosed is an electronic system comprising an input device, an output device, a processor device, and a memory device. The processor device is operably coupled to the input device and to the output device. The memory device is operably coupled to the processor device and comprises at least one microelectronic device structure. The at least one microelectronic device structure comprises at least one elongate isolation structure extending through an upper stack portion of a stack structure of vertically interleaved insulative structures and conductive structures. The at least one elongate isolation structure at least partially overlaps lower portions of pillars of neighboring columns of a pillar array, the pillars being electric ally coupled to conductive contacts of the memory device.

Figure 30:
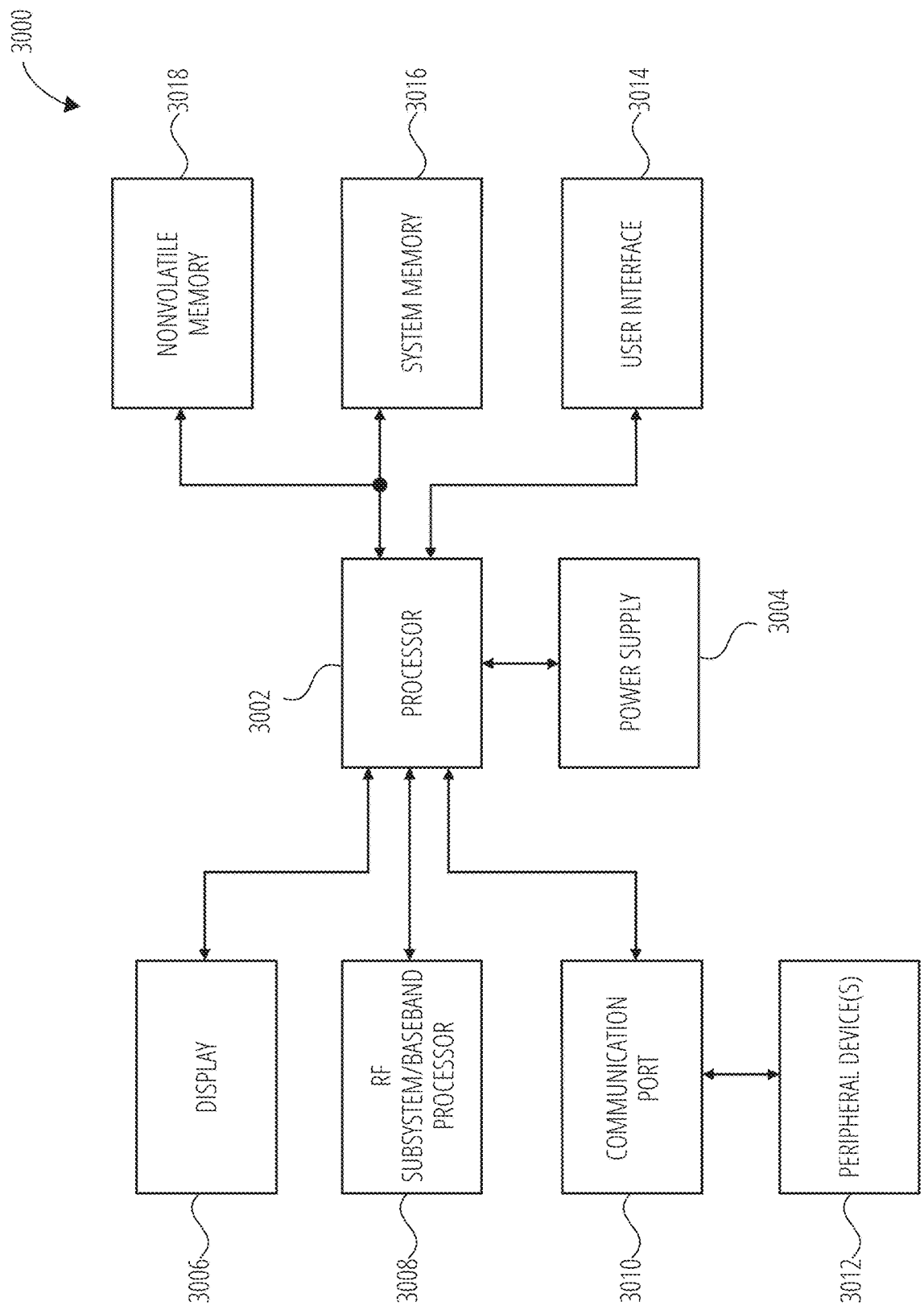
FIG. 30 is a block diagram of a processor-based system, in accordance with embodiments of the disclosure.

With reference to FIG. 30, shown is a block diagram of a processor-based system 3000. The processor-based system 3000 may include various microelectronic devices (e.g., the microelectronic device 2800 of FIG. 28) and microelectronic device structures (e.g., the microelectronic device structure 100 of FIG. 1, the microelectronic device structure 200 of FIG. 2, the microelectronic device structure 300 of FIG. 3, the microelectronic device structure 2000 of FIG. 20, the microelectronic device structure 2100 of FIG. 21, the microelectronic device structure 2400 of FIG. 24, the microelectronic device structure 2600 of FIG. 26, and/or the microelectronic device structure 2700 of FIG. 27) manufactured in accordance with embodiments of the present disclosure. The processor-based system 3000 may be any of a variety of types, such as a computer, a pager, a cellular phone, a personal organizer, a control circuit, or another electronic device. The processor-based system 3000 may include one or more processors 3002, such as a microprocessor, to control the processing of system functions and requests in the processor-based system 3000. The processor 3002 and other subcomponents of the processor-based system 3000 may include microelectronic devices (e.g., the microelectronic device 2800 of FIG. 28) and microelectronic device structures (e.g., the microelectronic device structure 100 of FIG. 1, the microelectronic device structure 200 of FIG. 2, the microelectronic device structure 300 of FIG. 3, the microelectronic device structure 2000 of FIG. 20, the microelectronic device structure 2100 of FIG. 21, the microelectronic device structure 2400 of FIG. 24, the microelectronic device structure 2600 of FIG. 26, and/or the microelectronic device structure 2700 of FIG. 27) manufactured in accordance with embodiments of the present disclosure.

The processor-based system 3000 may include a power supply 3004 in operable communication with the processor 3002. For example, if the processor-based system 3000 is a portable system, the power supply 3004 may include one or more of a fuel cell, a power scavenging device, permanent batteries, replaceable batteries, and/or rechargeable batteries. The power supply 3004 may also include an AC adapter; therefore, the processor-based system 3000 may be plugged into a wall outlet, for example. The power supply 3004 may also include a DC adapter such that the processor-based system 3000 may be plugged into a vehicle cigarette lighter or a vehicle power port, for example.

Various other devices may be coupled to the processor 3002 depending on the functions that the processor-based system 3000 performs. For example, a user interface 3014 may be coupled to the processor 3002. The user interface 3014 may include one or more input devices, such as buttons, switches, a keyboard, a light pen, a mouse, a digitizer and stylus, a touch screen, a voice recognition system, a microphone, or a combination thereof. A display 3006 may also be coupled to the processor 3002. The display 3006 may include an LCD display, an SED display, a CRT display, a DLP display, a plasma display, an OLED display, an LED display, a three-dimensional projection, an audio display, or a combination thereof. Furthermore, an RF subsystem/baseband processor 3008 may also be coupled to the processor 3002. The RF subsystem/baseband processor 3008 may include an antenna that is coupled to an RF receiver and to an RF transmitter. A communication port 3010, or more than one communication port 3010, may also be coupled to the processor 3002. The communication port 3010 may be adapted to be coupled to one or more peripheral devices 3012 (e.g., a modem, a printer, a computer, a scanner, a camera) and/or to a network (e.g., a local area network (LAN), a remote area network, an intranet, or the Internet).

The processor 3002 may control the processor-based system 3000 by implementing software programs stored in the memory (e.g., system memory 3016). The software programs may include an operating system, database software, drafting software, word processing software, media editing software, and/or media-playing software, for example. The memory (e.g., the system memory 3016) is operably coupled to the processor 3002 to store and facilitate execution of various programs. For example, the processor 3002 may be coupled to system memory 3016, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 3016 may include volatile memory, nonvolatile memory, or a combination thereof. The system memory 3016 is typically large so it can store dynamically loaded applications and data. In some embodiments, the system memory 3016 may include semiconductor devices (e.g., the microelectronic device 2800 of FIG. 28) and structures (e.g., the microelectronic device structure 100 of FIG. 1, the microelectronic device structure 200 of FIG. 2, the microelectronic device structure 300 of FIG. 3, the microelectronic device structure 2000 of FIG. 20, the microelectronic device structure 2100 of FIG. 21, the microelectronic device structure 2400 of FIG. 24, the microelectronic device structure 2600 of FIG. 26, and/or the microelectronic device structure 2700 of FIG. 27) described above, or a combination thereof.

The processor 3002 may also be coupled to nonvolatile memory 3018, which is not to suggest that system memory 3016 is necessarily volatile. The nonvolatile memory 3018 may include one or more of STT-MRAM, MRAM, read-only memory (ROM) (e.g., EPROM, resistive read-only memory (RROM)), and Flash memory to be used in conjunction with the system memory 3016. The size of the nonvolatile memory 3018 is typically selected to be just large enough to store any necessary operating system, application programs, and fixed data. Additionally, the nonvolatile memory 3018 may include a high-capacity memory (e.g., disk drive memory, such as a hybrid-drive including resistive memory or other types of nonvolatile solid-state memory, for example). The nonvolatile memory 3018 may include microelectronic devices (e.g., the microelectronic device 2800 of FIG. 28) and structures (e.g., the microelectronic device structure 100 of FIG. 1, the microelectronic device structure 200 of FIG. 2, the microelectronic device structure 300 of FIG. 3, the microelectronic device structure 2000 of FIG. 20, the microelectronic device structure 2100 of FIG. 21, the microelectronic device structure 2400 of FIG. 24, the microelectronic device structure 2600 of FIG. 26, and/or the microelectronic device structure 2700 of FIG. 27) described above, or a combination thereof.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
   a stack structure comprising a vertically alternating sequence of insulative structures and conductive structures arranged in tiers;
   a pair of slit structures extending through the stack structure to define a block;
   a series of pillars within the block, at least one of the pillars of the series in electrical communication with an additional conductive structure and comprising a channel material; and
   an isolation structure extending into an upper portion of the at least one of the pillars.

2. The microelectronic device of claim 1, wherein the stack structure further comprises:
   an upper stack comprising some of the insulative structures and some of the conductive structures in the vertically alternating sequence;
   a lower stack comprising some other of the insulative structures and some other of the conductive structures in the vertically alternating sequence; and
   at least one additional insulative structure between the upper stack and the lower stack, the at least one additional insulative structure being thicker than individual ones of the insulative structures.

3. The microelectronic device of claim 2, wherein a lower surface of the isolation structure is elevationally above the lower stack.

4. The microelectronic device of claim 2, wherein the at least one additional insulative structure comprises one or more of phosphosilicate glass (PSG), borosilicate glass (BSG), fluorosilicate glass (FSG), borophosphosilicate glass (BPSG), and silicon dioxide.

5. The microelectronic device of claim 1, wherein, in a lower portion of the at least one of the pillars, the channel material horizontally surrounds an insulative region of the at least one of the pillars of the series.

6. The microelectronic device of claim 5, wherein a portion of the channel material spaces the insulative region from another insulative region in the upper portion of the at least one of the pillars.

7. The microelectronic device of claim 1, wherein the isolation structure electrically isolates a first portion of some of the conductive structures from a second portion of some of the conductive structures.

8. The microelectronic device of claim 1, wherein the upper portion of the at least one of the pillars defines a lesser horizontal cross-sectional area than a horizontal cross-sectional area defined by a lower portion of the at least one of the pillars.

9. The microelectronic device of claim 8, wherein a sidewall of the upper portion of the at least one of the pillars is substantially coplanar with a sidewall of the lower portion of the at least one of the pillars.

10. The microelectronic device of claim 1, wherein the additional conductive structure extends horizontally over a portion of the isolation structure.

11. A microelectronic device, comprising:
    a stack structure comprising insulative structures vertically interleaved with conductive structures, the insulative structures and the conductive structures being arranged in tiers;
    pillars in electrical communication with other conductive structures and extending through the stack structure, the pillars comprising a channel material,
    in a lower portion of at least one of the pillars, the channel material having a substantially circular cross-sectional shape, and
    in an upper portion of the at least one of the pillars, the channel material having a partially circular cross-sectional shape; and
    an isolation trench extending through an upper portion of the stack structure adjacent the upper portion of the at least one of the pillars.

12. The microelectronic device of claim 11, wherein:
    in the lower portion of the at least one of the pillars, the channel material horizontally surrounds a lower insulative region; and
    in the upper portion of the at least one of the pillars, the channel material only partially surrounds an upper insulative region.

13. The microelectronic device of claim 12, wherein the isolation trench is in direct physical contact with the upper insulative region.

14. The microelectronic device of claim 12, wherein a portion of the channel material vertically spaces the lower insulative region from the upper insulative region.

15. The microelectronic device of claim 12, wherein the lower insulative region is in direct physical contact with the upper insulative region.

16. The microelectronic device of claim 12, further comprising, in the upper portion of the at least one of the pillars, an insulative spacer between the channel material and the isolation trench.

17. A method of forming a microelectronic device, the method comprising:
    forming a stack structure comprising a vertically alternation sequence of insulative structures and sacrificial structures arranged in tiers;
    forming pillars through the stack structure, the pillars comprising a channel material and being arranged in a series;
    forming a pair of slit openings through the stack structure to define a block, the series of the pillars being within the block;
    substantially replacing the sacrificial structures with conductive structures;
    forming an isolation structure extending into an upper portion of at least one of the pillars; and
    forming an additional conductive structure in electrical communication with the at least one of the pillars.

18. The method of claim 17, wherein forming the isolation structure extending into the upper portion of the at least one of the pillars comprises, removing portions of some of the conductive structures to define an elongate trench.

19. The method of claim 17, wherein forming the isolation structure comprises removing a portion of the channel material from the upper portion of the at least one of the pillars.

20. The method of claim 19, further comprising, after removing the portion of the channel material forming an insulative spacer region on an exposed portion of the channel material.

* * * * *